(12) United States Patent
Chiu et al.

(10) Patent No.: US 11,901,442 B2
(45) Date of Patent: Feb. 13, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Ya-Wen Chiu, Tainan (TW); Yi Che Chan, Hsinchu (TW); Lun-Kuang Tan, Hsinchu (TW); Zheng-Yang Pan, Zhubei (TW); Cheng-Po Chau, Tainan (TW); Pin-Chu Liang, Changhua County (TW); Hung-Yao Chen, Hsinchu (TW); De-Wei Yu, Ping-tung (TW); Yi-Cheng Li, Yunlin County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/875,279

(22) Filed: Jul. 27, 2022

(65) Prior Publication Data
US 2022/0376091 A1    Nov. 24, 2022

Related U.S. Application Data

(62) Division of application No. 17/109,895, filed on Dec. 2, 2020, now Pat. No. 11,677,015.
(Continued)

(51) Int. Cl.
*H01L 21/8238* (2006.01)
*H01L 27/092* (2006.01)
(Continued)

(52) U.S. Cl.
CPC .... *H01L 29/66818* (2013.01); *H01L 21/0262* (2013.01); *H01L 21/02532* (2013.01);
(Continued)

(58) Field of Classification Search
None
See application file for complete search history.

(56) References Cited

U.S. PATENT DOCUMENTS

| 8,624,326 B2 | 1/2014 | Chen et al. |
| 9,711,608 B1 | 7/2017 | Duriez et al. |

(Continued)

FOREIGN PATENT DOCUMENTS

| CN | 103066123 A | 4/2013 |
| CN | 107464840 A | 12/2017 |

(Continued)

OTHER PUBLICATIONS

Notice of Allowance issued in corresponding U.S. Appl. No. 17/109,895, dated Feb. 1, 2023.
(Continued)

*Primary Examiner* — Xiaoming Liu
(74) *Attorney, Agent, or Firm* — STUDEBAKER & BRACKETT, PC

(57) ABSTRACT

In a method of manufacturing a semiconductor device, a fin structure having a channel region protruding from an isolation insulating layer disposed over a semiconductor substrate is formed, a cleaning operation is performed, and an epitaxial semiconductor layer is formed over the channel region. The cleaning operation and the forming the epitaxial semiconductor layer are performed in a same chamber without breaking vacuum.

20 Claims, 22 Drawing Sheets

Related U.S. Application Data

(60) Provisional application No. 63/024,377, filed on May 13, 2020.

(51) Int. Cl.
*H01L 29/66* (2006.01)
*H01L 21/02* (2006.01)
*H01L 29/10* (2006.01)
*H01L 29/161* (2006.01)
*H01L 29/78* (2006.01)

(52) U.S. Cl.
CPC ............... *H01L 21/02661* (2013.01); *H01L 21/823807* (2013.01); *H01L 21/823821* (2013.01); *H01L 27/0924* (2013.01); *H01L 29/1037* (2013.01); *H01L 29/161* (2013.01); *H01L 29/6681* (2013.01); *H01L 29/7851* (2013.01)

(56) References Cited

U.S. PATENT DOCUMENTS

| | | |
|---|---|---|
| 2008/0296681 A1 | 12/2008 | Georgakos et al. |
| 2010/0237432 A1* | 9/2010 | Takeoka .......... H01L 21/823878 257/E21.546 |
| 2017/0025535 A1 | 1/2017 | Wu et al. |
| 2017/0069630 A1 | 3/2017 | Cha et al. |
| 2019/0043857 A1 | 2/2019 | Wu et al. |
| 2019/0122939 A1 | 4/2019 | Lee et al. |
| 2019/0157049 A1 | 5/2019 | Sato et al. |
| 2019/0157156 A1 | 5/2019 | Chen et al. |
| 2019/0378724 A1 | 12/2019 | Toda et al. |
| 2020/0058560 A1 | 2/2020 | Chen et al. |
| 2020/0075729 A1* | 3/2020 | Yen .................. H01L 21/02164 |
| 2020/0135580 A1 | 4/2020 | Hsieh et al. |
| 2020/0135725 A1 | 4/2020 | Wu et al. |

FOREIGN PATENT DOCUMENTS

| | | |
|---|---|---|
| DE | 102008025708 B4 | 5/2011 |
| KR | 10-2020-0049574 | 5/2020 |
| TW | 201820483 | 6/2018 |

OTHER PUBLICATIONS

Non-Final Office Action ssued in corresponding U.S. Appl. No. 17/109,895, dated May 11, 2022.
Final Office Action issued in U.S. Appl. No. 17/109,895, dated Nov. 8, 2022.

* cited by examiner

METHOD OF MANUFACTURING A SEMICONDUCTOR DEVICE AND A SEMICONDUCTOR DEVICE

RELATED APPLICATIONS

This application is a divisional of U.S. patent application Ser. No. 17/109,895 filed Dec. 2, 2020, which claims priority to U.S. Provisional Application No. 63/024,377 filed on May 13, 2020, the entire contents of each of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, channel regions of an n-type FET and a p-type FET are made of different materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, processes and/or methods explained with respect to one or more figures and/or embodiments can be applied to other figures and/or embodiments, and detailed description thereof may be omitted for simplicity.

FIGS. 1-11B show various views of a sequential manufacturing operation of a semiconductor device according to the present disclosure. It is understood that additional operations may be provided before, during, and after the processes shown by FIGS. 1-11B, and some of the operations described below can be replaced or eliminated for additional embodiments of the method. The order of the operations/processes may be interchangeable.

Figure 1:
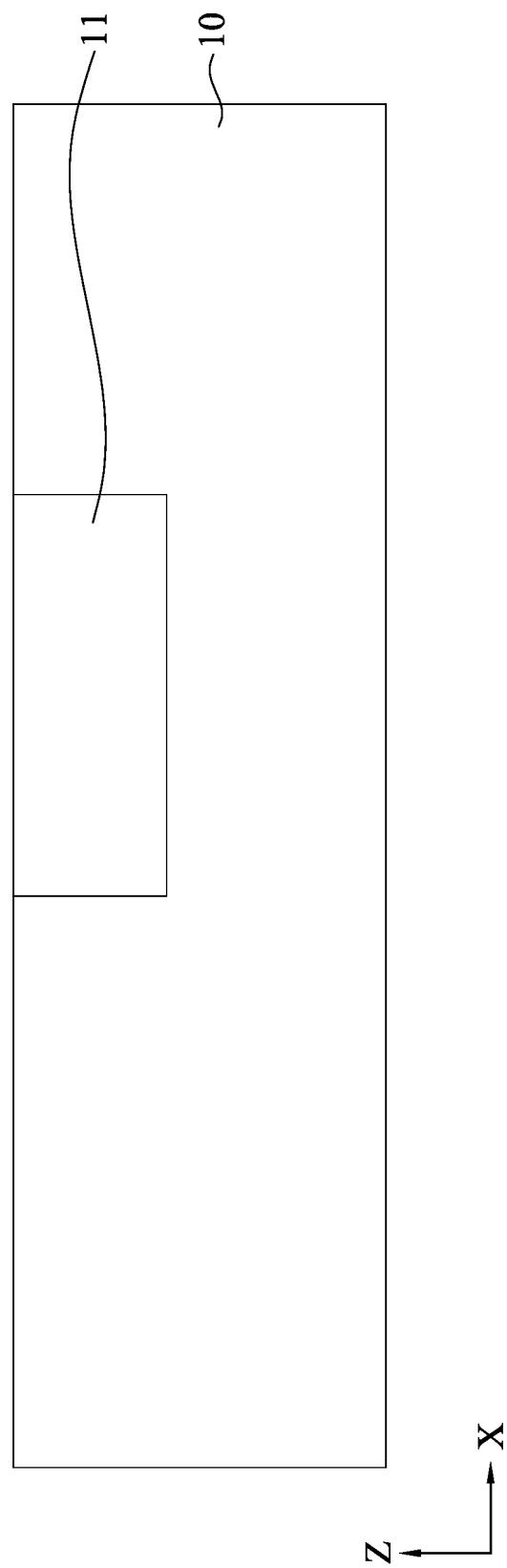
FIG. 1 shows one of the various stages of a sequential manufacturing operation of a semiconductor FET device according to an embodiment of the present disclosure.

As shown in FIG. 1, a part of a substrate 10 made of a first semiconductor material, in which one or more p-type FETs are subsequently formed, is etched to form a recess by one or more lithography and etching operations, and the recess is filled with a second semiconductor material. In one embodiment, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include various regions that have been suitably doped with impurities (e.g., p-type or n-type conductivity). The dopants are, for example boron ($BF_2$) for an n-type Fin FET and phosphorus for a p-type Fin FET.

As shown in FIG. 1, an epitaxial layer 11 made of the second semiconductor material is formed in the recess. In some embodiments, the epitaxial layer 11 is made of SiGe. In some embodiments, the germanium concentration of the SiGe layer 11 is in a range from about 5 atomic % to about 40 atomic % and in other embodiments, the germanium concentration of the SiGe layer 11 is in a range from about 10 atomic % to about 30 atomic %. In some embodiments, the SiGe layer 11 is doped with a p-type dopant (e.g., boron). In some embodiments, one or more buffer layer having a lower Ge concentration than the epitaxial layer 11 is formed between the epitaxial layer 11 and the substrate 10. The SiGe layer 11 can be formed by chemical vapor deposition (CVD), such as low pressure CVD (LPCVD) and plasma enhanced CVD (PECVD), molecular beam epitaxy (MBE), atomic layer deposition (ALD), or other suitable process.

Figure 2:
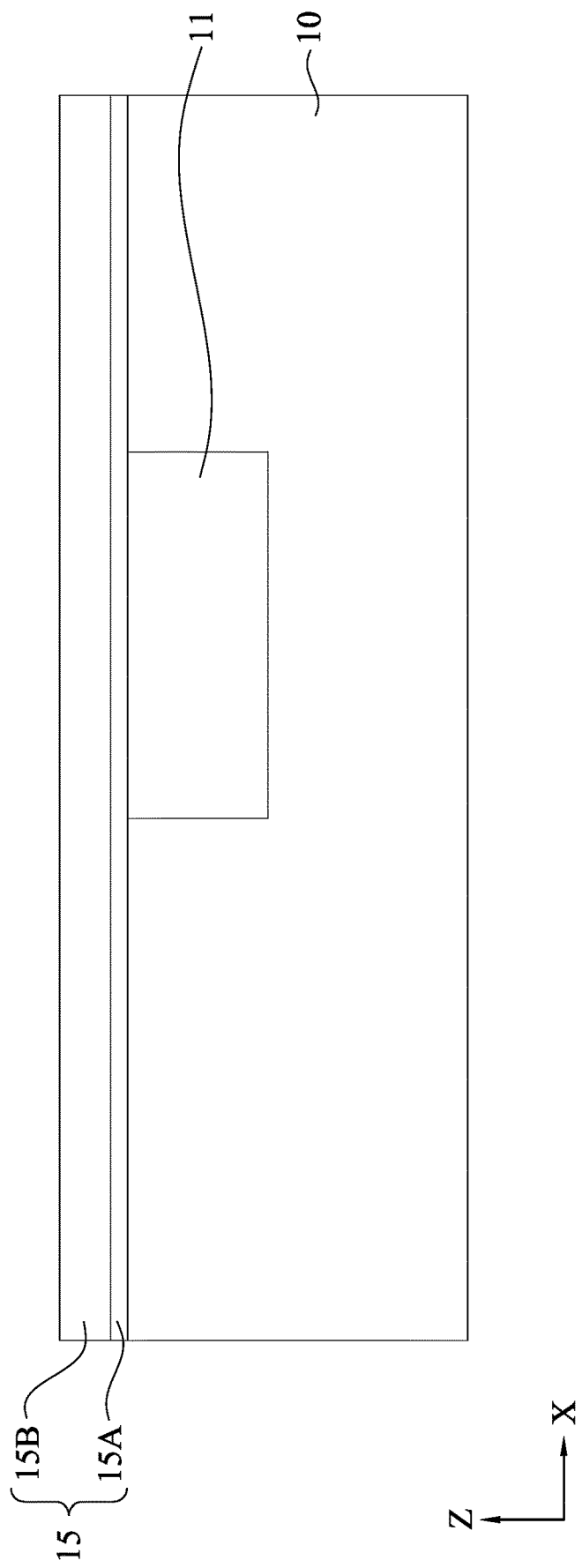
FIG. 2 shows one of the various stages of a sequential manufacturing operation of a semiconductor FET device according to an embodiment of the present disclosure.

Further, as shown in FIG. 2, a mask layer 15 is formed over the substrate 10 and the epitaxial layer 11. In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by CVD, PVD, ALD, or other suitable process.

Figure 3:
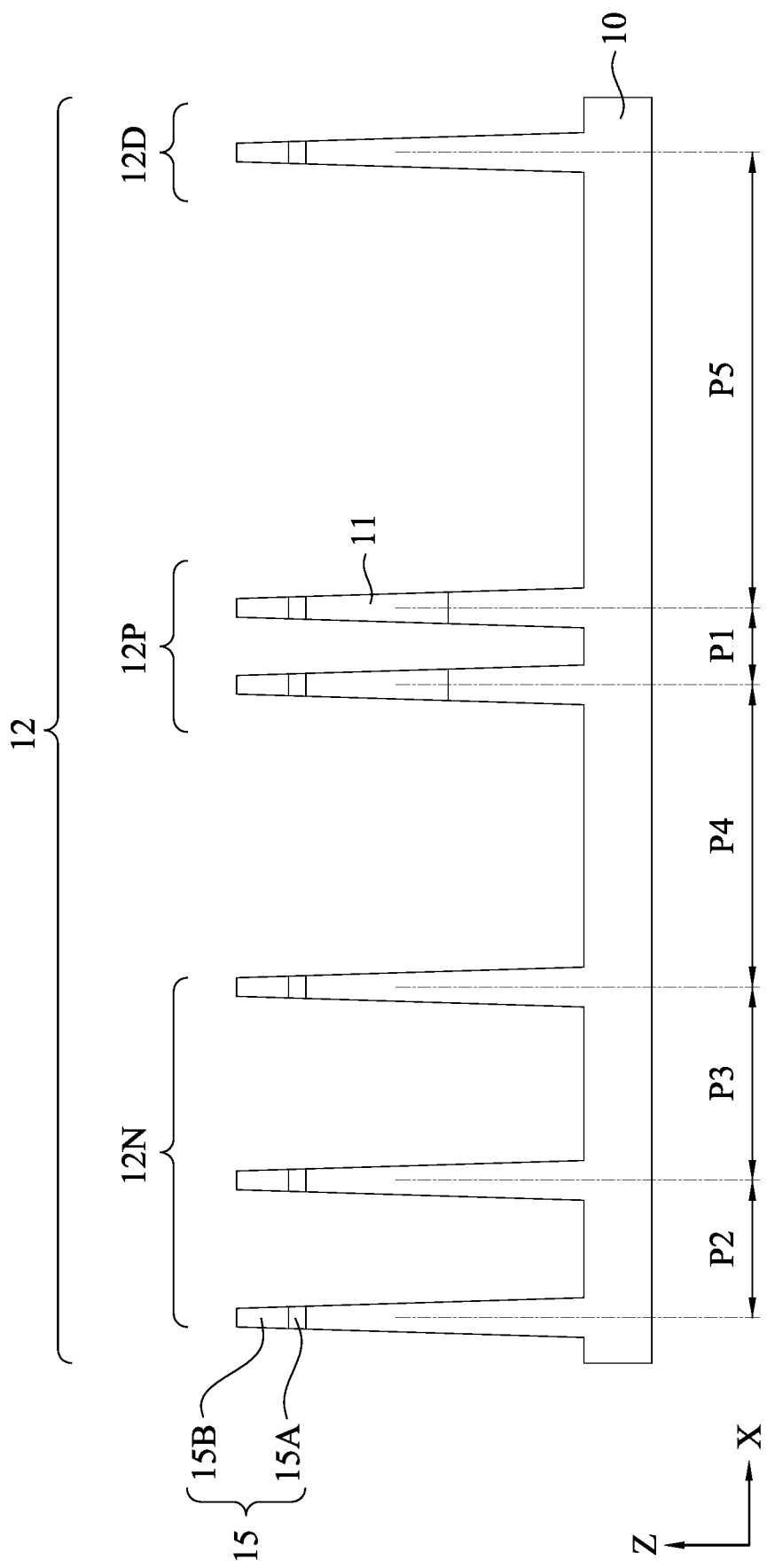
FIG. 3 shows one of the various stages of a sequential manufacturing operation of a semiconductor FET device according to an embodiment of the present disclosure.

Next, as shown in FIG. 3, the mask layer 15, the substrate 10 and the epitaxial layer 11 in the p-type region are patterned by using the patterned mask layer, thereby forming fin structures 12N and 12P (collectively fin structures 12) extending in the Y direction. In some embodiments, the fin structures 12N are for an n-type FET, and the fin structures 12P are for a p-type FET. In FIG. 3, three n-type fin structures 12N and two p-type fin structures are arranged in the X direction. However, the number of the fin structures is not limited to two or three, and may be as small as one and four or more. In some embodiments, one or more dummy fin structures 12D are formed on one or both sides of the fin structures 12 to improve pattern fidelity in the patterning operations.

The fin structures 12 can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and is patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures. The width of the fin structure 12 is in a range of about 5 nm to about 40 nm in some embodiments, and is in a range of about 7 nm to about 15 nm in certain other embodiments. The height of the fin structure 12 is in a range of about 100 nm to about 300 nm in some embodiments, and is in a range of about 50 nm to 100 nm in other embodiments. The space between the fin structures 12 is in a range of about 5 nm to about 80 nm in some embodiments, and may be in a range of about 7 nm to 20 nm in other embodiments. In some embodiments, a pitch of the fin structures is in a range from about 10 nm to 120 nm, and is in a range from about 14 nm to about 35 nm in other embodiments. One skilled in the art will realize, however, that the dimensions and values recited throughout the descriptions are merely examples, and may be changed to suit different scales of integrated circuits.

In some embodiments, a plurality of fin structures having a constant pitch are formed and then some of the fin structures are removed to obtain the structure shown in FIG. 3. In some embodiments, some of the fin structures are cut into pieces for respective FETs.

In some embodiments, the p-type fin structures 12P are arranged with a first pitch P1, and three n-type fin structures 12N are arranged with a second pitch P2 and a third pitch P3. In some embodiments, the first pitch P1 is a minimum pitch (P0) for the fin structures defined by a design rule. In some embodiments, the second pitch P2 is greater than the first pitch P1 and is equal to 2P0 or 3P0. In some embodiments, the third pitch P3 is greater than the second pitch P2 and is equal to 3P0, 4P0 or 5P0. In some embodiments, the fourth pitch P4 between the n-type fin structure 12N and the p-type fin structure 12P and the fifth pitch P5 between the p-type fin structure 12P and the dummy fin structure 12D are greater than the first pitch P1 and is equal to 2P0, 3P0, 4P0, 5P0 or more.

Figure 4:
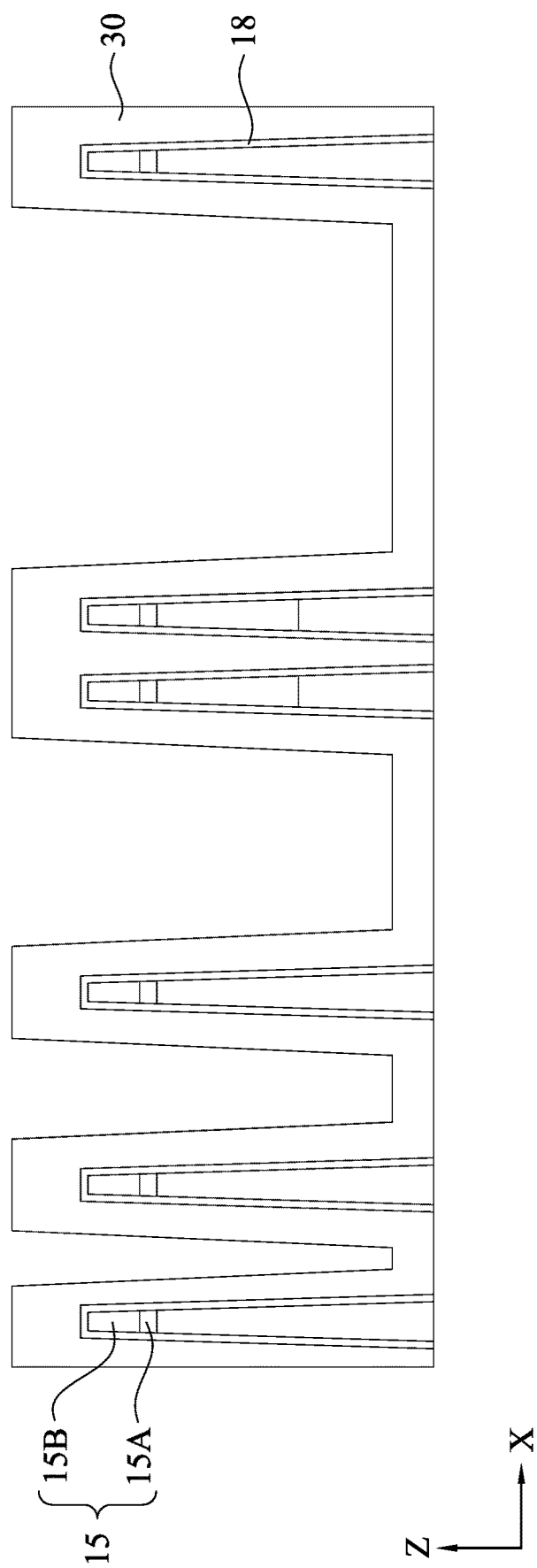
FIG. 4 shows one of the various stages of a sequential manufacturing operation of a semiconductor FET device according to an embodiment of the present disclosure.

After the fin structures 12 are formed, a first dielectric layer 30 is formed over the fin structures 12 as shown in FIG. 4. The first dielectric layer 30 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, silicon oxide is used as the first dielectric layer 30. In some embodiments, as shown in FIG. 4, the first dielectric layer 30 is conformally formed over the fin structures 12 such that a space is formed between adjacent fin structures 12, except for the p-type fin structures 12P. For the p-type fin structures 12P, since the space between the fin structures is small, the first dielectric layer fully fills the space therebetween as shown in FIG. 4. The thickness of the first dielectric layer 30 is adjusted so that the space between the fin structures (e.g., n-type fin structures with the second pitch) is in a range of about 5 nm to about 40 nm in some embodiments, and is in a range of about 7 nm to about 15 nm in certain embodiments.

In some embodiments, one or more liner dielectric layers 18 are formed between the first dielectric layer 30 and the fin structures as shown in FIG. 4. In some embodiments, the liner dielectric layer 18 is made of a different material than the first dielectric layer 30 and includes one or more layers of insulating materials such as silicon oxide, silicon oxynitride, silicon nitride, SiOC, SiCN or SiOCN formed by LPCVD, plasma-CVD or ALD, or any other suitable film formation method. The thickness of the liner dielectric layer 18 is in a range from about 1 nm to about 5 nm in some embodiments.

Figure 5:
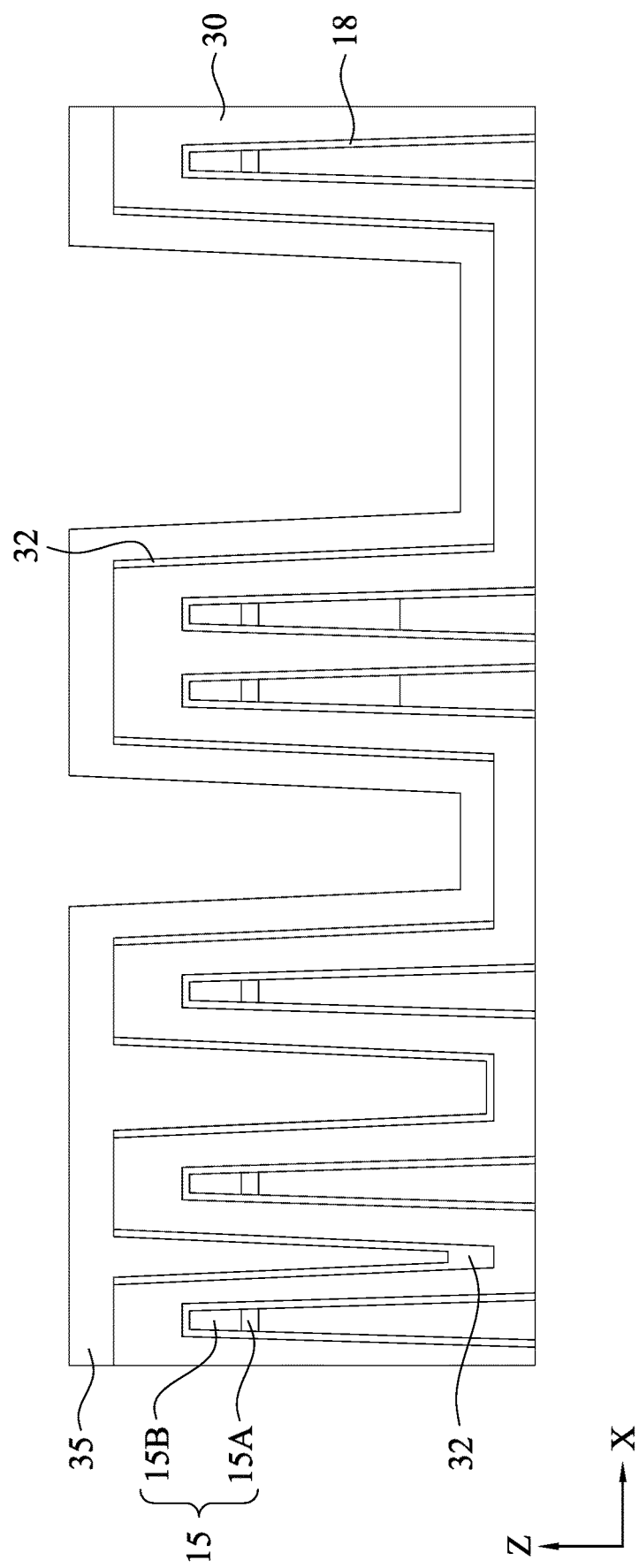
FIG. 5 shows one of the various stages of a sequential manufacturing operation of a semiconductor FET device according to an embodiment of the present disclosure.

After the first dielectric layer 30 is formed, a second dielectric layer 35 is formed over the first dielectric layer 30, as shown in FIG. 5. The material of the second dielectric layer 35 is different from the material of the first dielectric layer 30 and, in some embodiments, is also different from the material of the liner dielectric layer 18. In some embodiments, the second dielectric layer 35 includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the second dielectric layer 35 is made of silicon nitride. As shown in FIG. 5, the second dielectric layer 35 fully fills the first space in the n-type fin structures, and covers the top of the first dielectric layer 30, in some embodiments. As shown in FIG. 5, the second dielectric layer 35 is conformally formed over the first dielectric layer where the pitches of the fin structures are large (e.g., equal to or more than 4P0).

In some embodiments, one or more additional dielectric layers 32 are formed between the first dielectric layer 30 and the second dielectric layer 35 as shown in FIG. 5. In some embodiments, the additional dielectric layer 32 is made of a different material than the second dielectric layer 35 and includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the additional dielectric layer 32 is made of a different material than the first dielectric layer 30. The thickness of the additional dielectric layer 32 is in a range from about 1 nm to about 5 nm in some embodiments.

In some embodiments, after the second dielectric layer 35 is formed, a planarization operation, such as an etch-back process or a chemical mechanical polishing (CMP) process, is performed to planarize the upper surface of the second dielectric layer 35.

Figure 6:
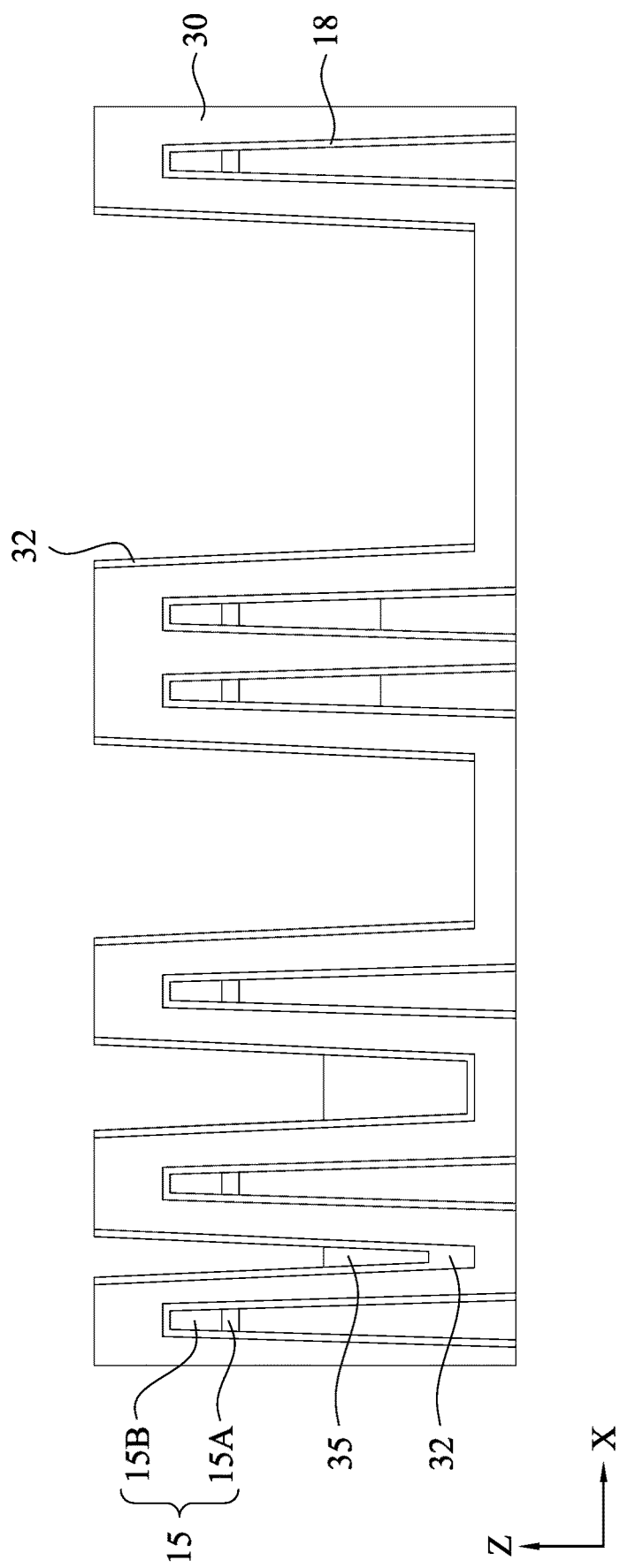
FIG. 6 shows one of the various stages of a sequential manufacturing operation of a semiconductor FET device according to an embodiment of the present disclosure.

Next, the second dielectric layer 35 is recessed down below the top of the fin structures 12 by using a suitable dry and/or wet etching operation, as shown in FIG. 6. Since the second dielectric layer 35 is made of a different material than the first dielectric layer 30, the second dielectric layer 35 is selectively etched against the first dielectric layer 30. In some embodiments, the additional dielectric layer 32 remains on sidewalls of the first dielectric layer 30. As shown in FIG. 6, a space is formed over the recessed second dielectric layer 35 in relatively narrow spaces (e.g., pitch P2, P3) between fin structures. In relatively wide spaces between fin structures (e.g., pitch P4, P5), the second dielectric layer 35 is fully removed. In some embodiments, the additional dielectric layer 32 is also removed in the relatively wide spaces, and thus, the first dielectric layer 30 is exposed. In some embodiments, the upper surface of the recessed second dielectric layer 35 has a V-shape or a U-shape.

Figure 7:
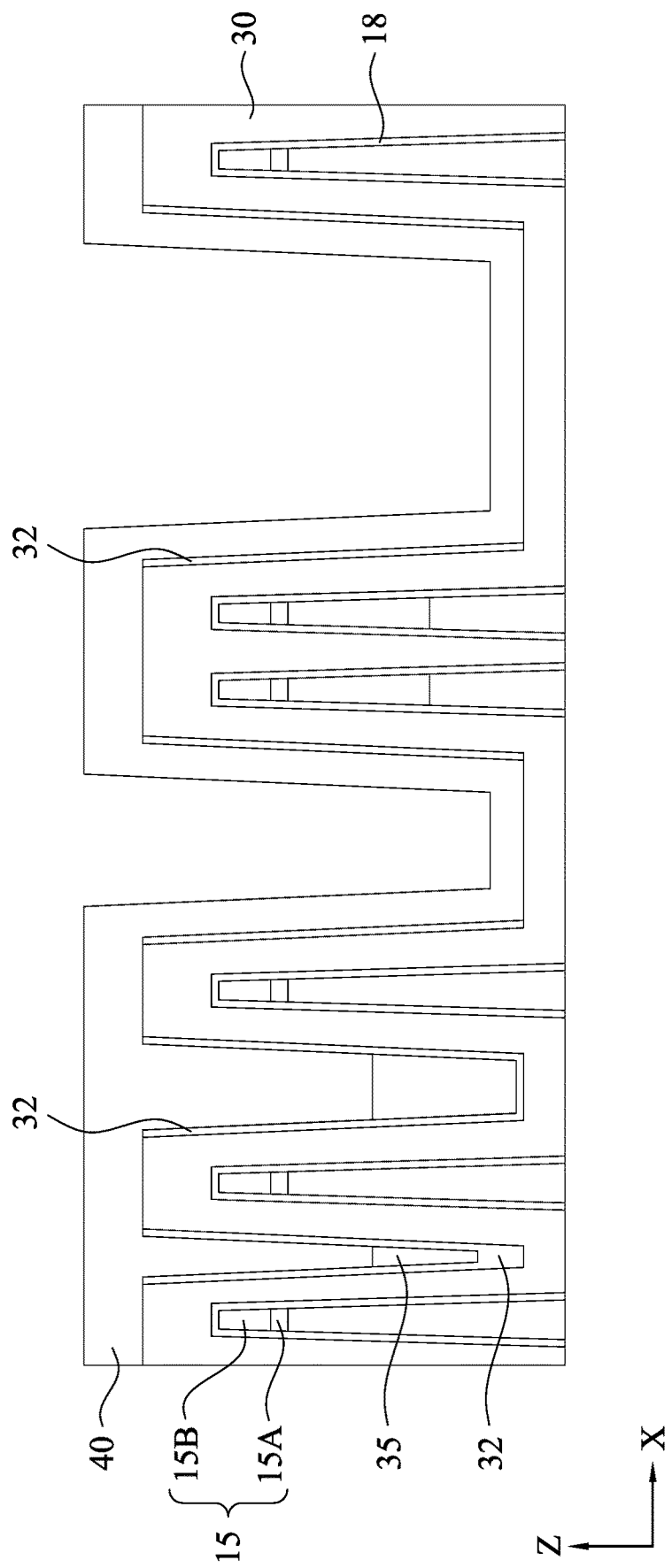
FIG. 7 shows one of the various stages of a sequential manufacturing operation of a semiconductor FET device according to an embodiment of the present disclosure.

Further, after the second dielectric layer 35 is recessed, a third dielectric layer 40 is formed over the first dielectric layer 30, the additional dielectric layer 32, and the recessed second dielectric layer 35, as shown in FIG. 7. The material of the third dielectric layer 40 is different from the materials of the first dielectric layer 30, the additional dielectric layer 32 and the second dielectric layer 35. In some embodiments, the third dielectric layer 40 includes a material having a lower etching rate than the second dielectric layer 35 against a polysilicon etching. In some embodiments, the third dielectric layer 40 includes a high-k dielectric material. In some embodiments, the third dielectric layer 40 includes a dielectric material having a higher dielectric constant (k) than the second dielectric layer 35, the additional dielectric layer 32 and/or the first dielectric layer 30. When the upper surface of the recessed second dielectric layer 35 has a V-shape or a U-shape, the bottom of the third dielectric layer 40 has a V-shape or a U-shape.

In some embodiments, the third dielectric layer 40 includes one or more of non-doped hafnium oxide (e.g., $HfO_x$, $0 < x \leq 2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer 40. The third dielectric layer 40 can be formed by LPCVD, plasma-CVD or ALD, or any other suitable film formation method. In some embodiments, the second dielectric layer 35 is made of silicon nitride. As shown in FIG. 7, the third dielectric layer 40 fully fills the relatively narrow spaces and covers the top of the first dielectric layer 30, in some embodiments. In some embodiments, after the third dielectric layer 40 is formed, a planarization operation, such as an etch-back process or a CMP process, is performed to planarize the upper surface of the third dielectric layer 40. At the relatively wide spaces between fin structures, the third dielectric layer 40 is conformally formed over the first dielectric layer 30 and the additional dielectric layer 32, as shown in FIG. 7.

Figure 8:
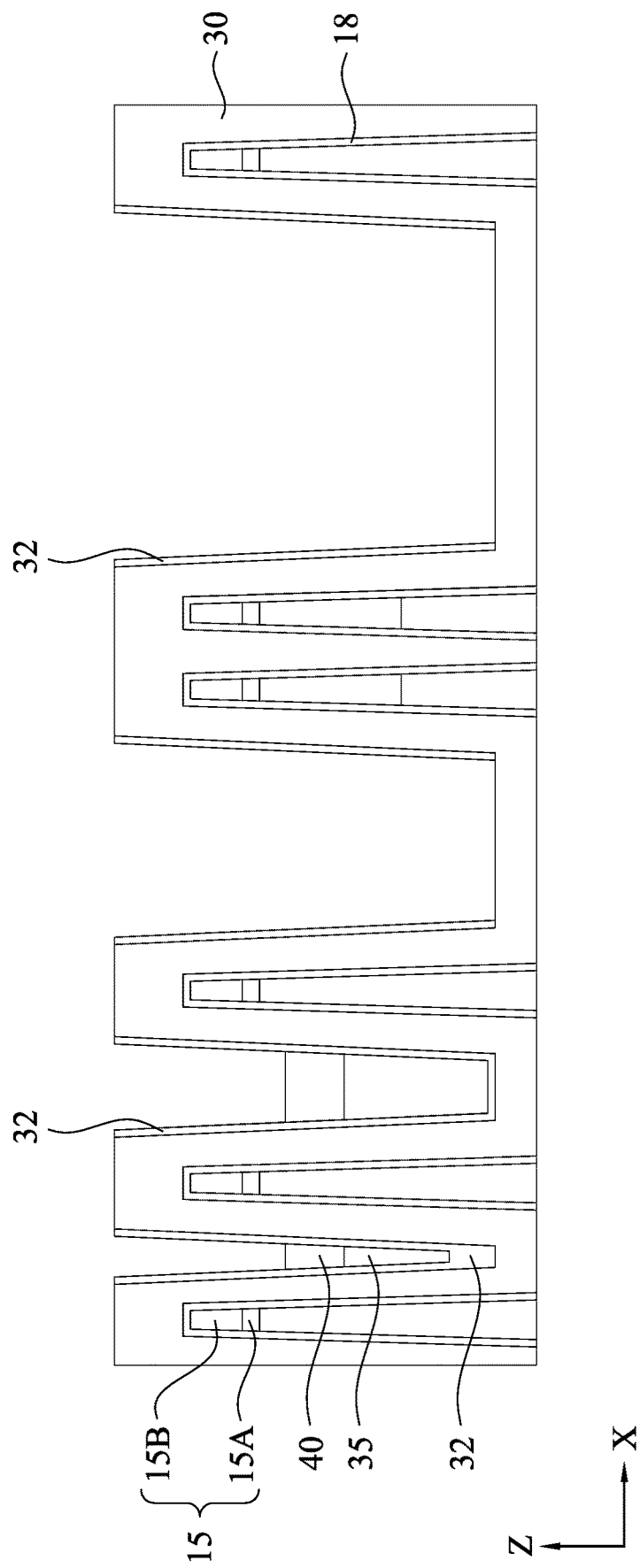
FIG. 8 shows one of the various stages of a sequential manufacturing operation of a semiconductor FET device according to an embodiment of the present disclosure.

Next, the third dielectric layer 40 is recessed down below the top of the fin structures 12 by using a suitable dry and/or wet etching operation, as shown in FIG. 8. Since the third dielectric layer 40 is made of a different material than the additional dielectric layer 32 and the first dielectric layer 30, the third dielectric layer 40 is selectively etched against the additional dielectric layer 32 and the first dielectric layer 30. As shown in FIG. 8, a space is formed over the recessed third dielectric layer 40. In some embodiments, the upper surface of the recessed third dielectric layer 30 has a V-shape or a U-shape. At the relatively wide spaces between fin structures, the third dielectric layer 40 is fully removed and the first dielectric layer 30 is exposed, as shown in FIG. 8.

Figure 9:
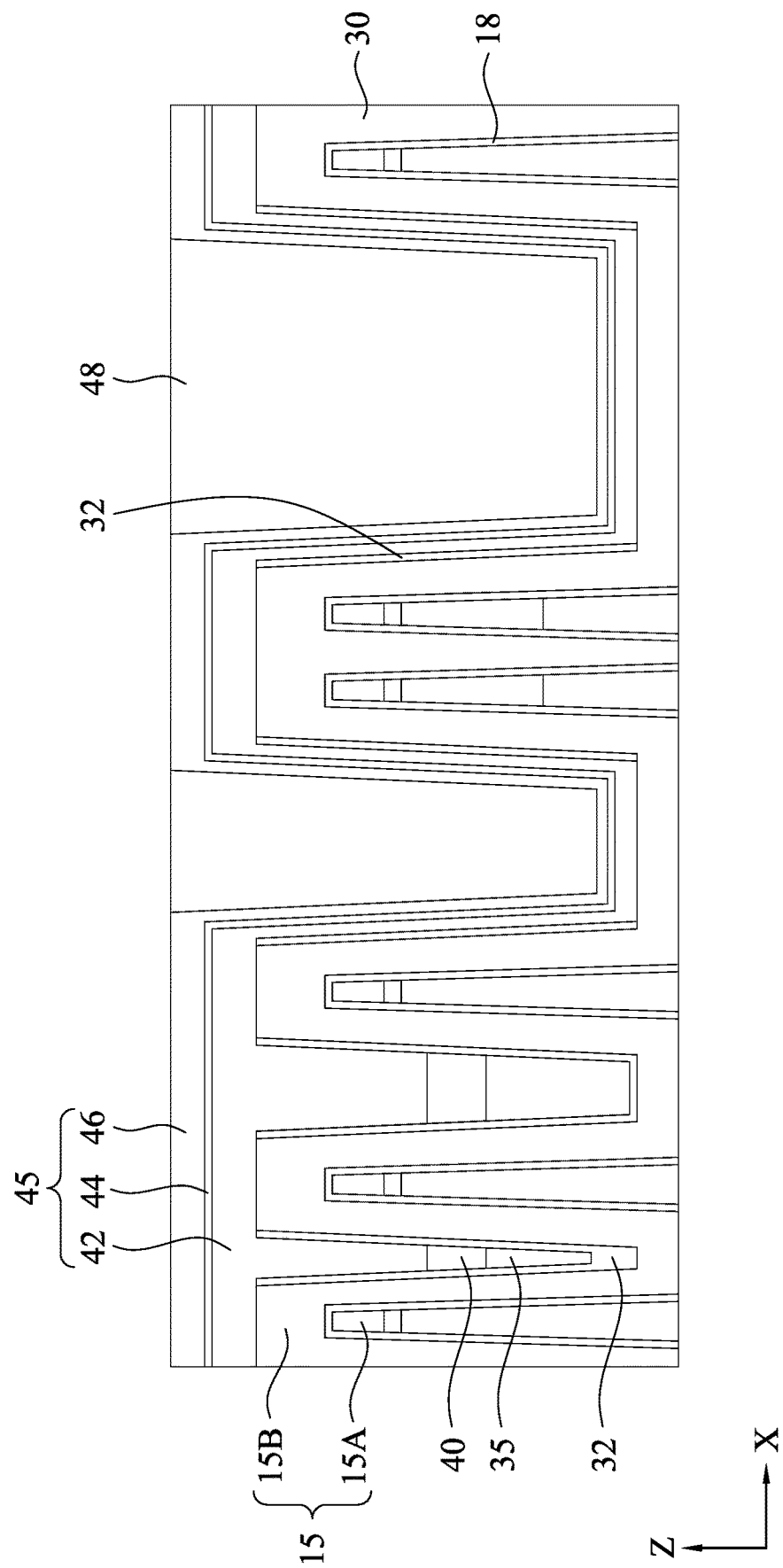
FIG. 9 shows one of the various stages of a sequential manufacturing operation of a semiconductor FET device according to an embodiment of the present disclosure.

Then, in some embodiments, a fourth dielectric layer 45 is formed over the first dielectric layer 30, the additional dielectric layer 32 and the recessed third dielectric layer 40, as shown in FIG. 9. In some embodiments, the fourth dielectric layer 45 includes multiple dielectric layers. In some embodiments, the fourth dielectric layer includes a lower layer 42, a middle layer 44 and an upper layer 46. In some embodiments, the materials for the lower, middle and upper layers are different from each other, and in other embodiments, the middle layer is made of a different material than the lower and the upper layers. In some embodiments, the fourth dielectric layer 45 is made of a same or a different material than the first, second and/or third dielectric layers and includes one or more of silicon oxide, silicon oxynitride, silicon nitride, SiOC, SiCN, or SiOCN formed by LPCVD, plasma-CVD or ALD, or any other suitable film formation method. In some embodiments, the thickness of the middle layer 44 is smaller than the thickness of the lower layer 42 and the upper layer 46.

Further, as shown in FIG. 9, a fifth dielectric layer 48 is formed over the fourth dielectric layer 45, and then a planarization operation, such as a CMP operation, is performed. In some embodiments, the fifth dielectric layer 48 is made of a different material than the fourth dielectric layer (at least the upper layer 46) and includes one or more of silicon oxide, silicon oxynitride, silicon nitride, SiOC, SiCN, or SiOCN formed by LPCVD, plasma-CVD or ALD, or any other suitable film formation method.

Figure 10:
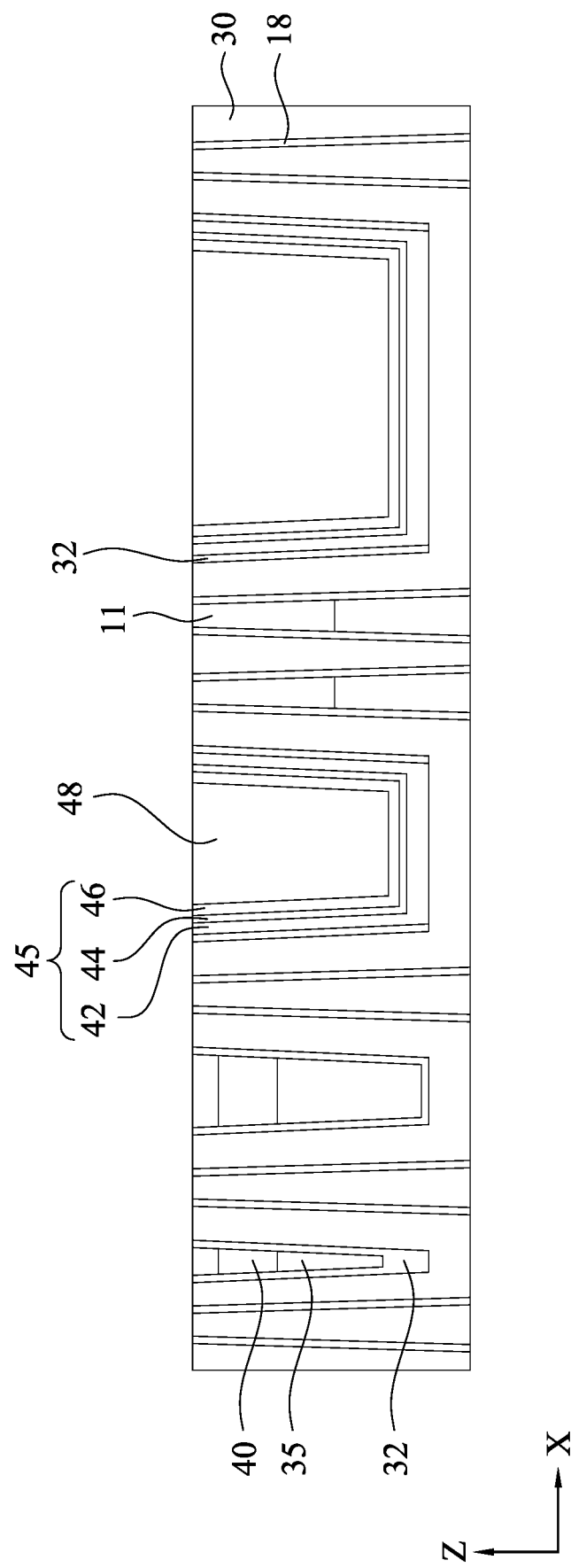
FIG. 10 shows one of the various stages of a sequential manufacturing operation of a semiconductor FET device according to an embodiment of the present disclosure.

Then, as shown in FIG. 10, a planarization operation is further performed to expose the top of the fin structures 12.

Figure 11A:
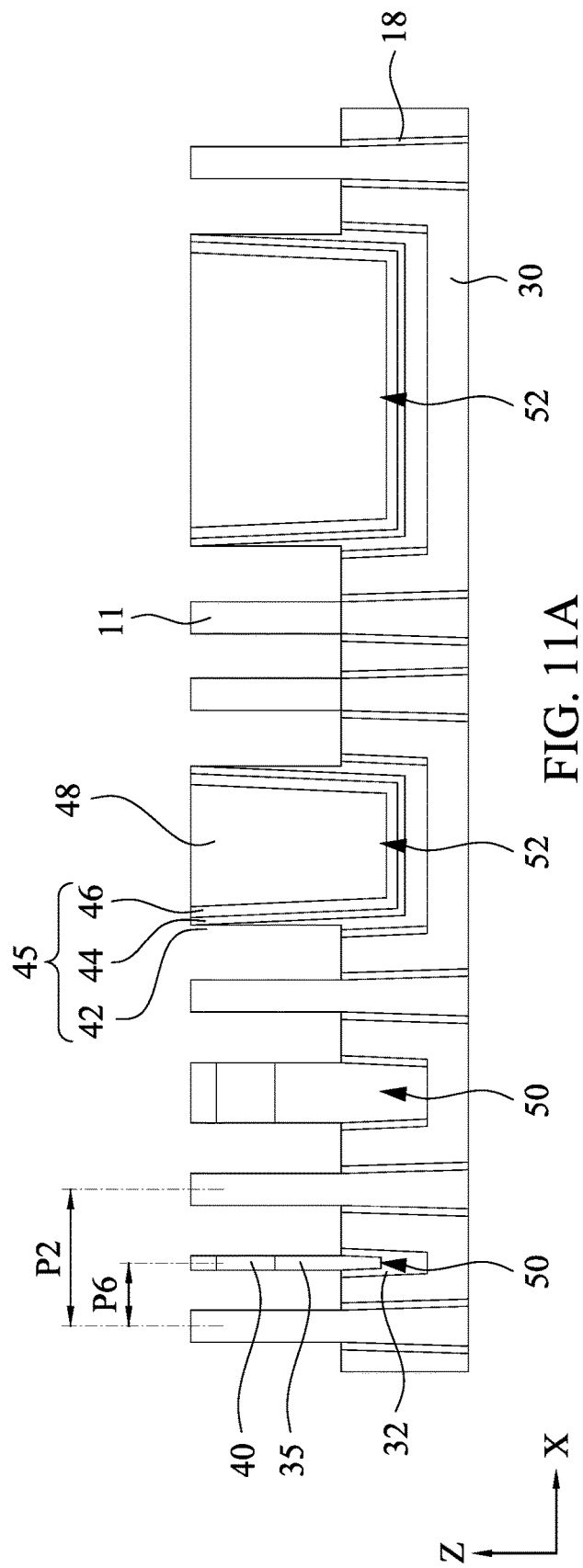
FIGS. 11A and 11B show one of the various stages of a sequential manufacturing operation of a semiconductor FET device according to an embodiment of the present disclosure.

Next, the first dielectric layer 30 and the liner dielectric layer 18 formed on side walls of the fin structures are recessed to expose channel regions of the fin structures, as shown in FIG. 11A. In some embodiments, the first dielectric layer 30 is recessed to about the level of the bottom of the SiGe layer 11 (e.g., ±2 nm). The recessed first dielectric layer 30 functions as an isolation insulating layer (e.g., shallow trench isolation (STI)) to electrically isolate one fin structure from adjacent fin structures.

By recessing the first dielectric layer a wall fin 50 (dummy dielectric fin) is formed between relatively narrow spaces of the fin structures. As shown in FIG. 11A, the wall fin 50 includes a part of the lower layer 42 of the fourth dielectric layer, the recessed third dielectric layer 40 formed on the recessed second dielectric layer 35, as a hybrid fin structure. In relatively wide spaces, a wall structure 52 including the fourth dielectric layer 45 and the fifth dielectric layer is formed. In some embodiments, a part of the additional dielectric layer 32 is also included in the wall structure 52 and is embedded in the first dielectric layer 30. In some embodiments, the wall structure 52 does not include the second dielectric layer 35 and the third dielectric layer 40. In some embodiments, depending on the space widths of adjacent fin structures, the widths of the wall fin structures are different. In some embodiments, when the pitch of the adjacent fin structures is more than P0 (minimum pitch) and equal to or less than 4P0 (or 3P0), a wall fin structure is formed, and when the pitch of the adjacent fin structures is more than 4P0 (or 3P0), a wall structure is formed. Whether a wall fin structure or a wall structure is formed also depends on a thickness of one or more of the first, second or third dielectric layers. In some embodiments, the pitch P6 between the n-type fin structure and the wall fin structure 50 is ½P2. In some embodiments, the space between two n-type fin structures is about ⅔ of the space between the n-type fin structure and the wall fin structure 50 at the center of the top of the fin structure.

Figure 11B:
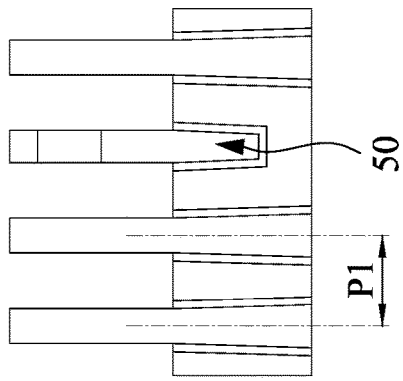

In some embodiments, when n-type fin structures 12N are arranged with the pitch P0, no wall fin structure 50 is formed between the fin structures as shown in FIG. 11B similar to the p-type fin structures 12P with a pitch P1 (=P0), as shown in FIG. 11A. When the p-type fin structures are arranged with a pitch greater than P0 (e.g., P2 or more), a wall fin structure or a wall structure is formed between the p-type fin structures.

Figure 12B:
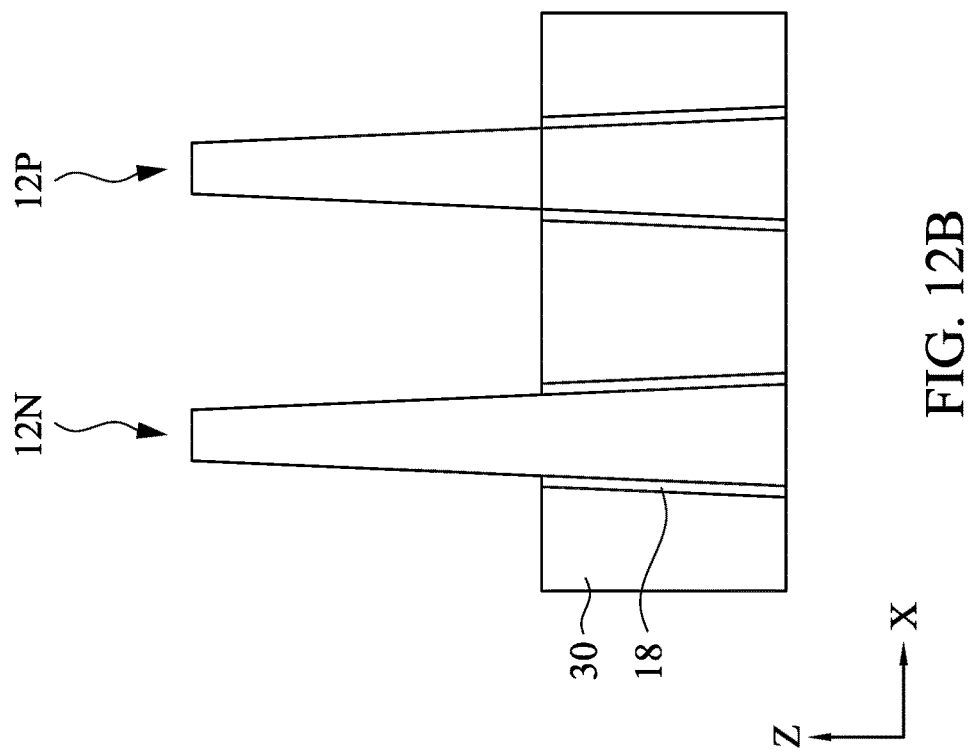
FIGS. 12A, 12B, 12C and 12D show various stages of a sequential manufacturing operation of a semiconductor FET device according to an embodiment of the present disclosure.

FIGS. 12A, 12B, 12C and 12D show various stages of a sequential manufacturing operation of a semiconductor FET device according to an embodiment of the present disclosure. It is understood that additional operations may be provided before, during, and after the processes shown by FIGS. 12A-12D, and some of the operations described below can be replaced or eliminated for additional embodiments of the method. The order of the operations/processes may be interchangeable. FIG. 13 shows a flow chart for forming the cap semiconductor layer 13.

Figure 12A:
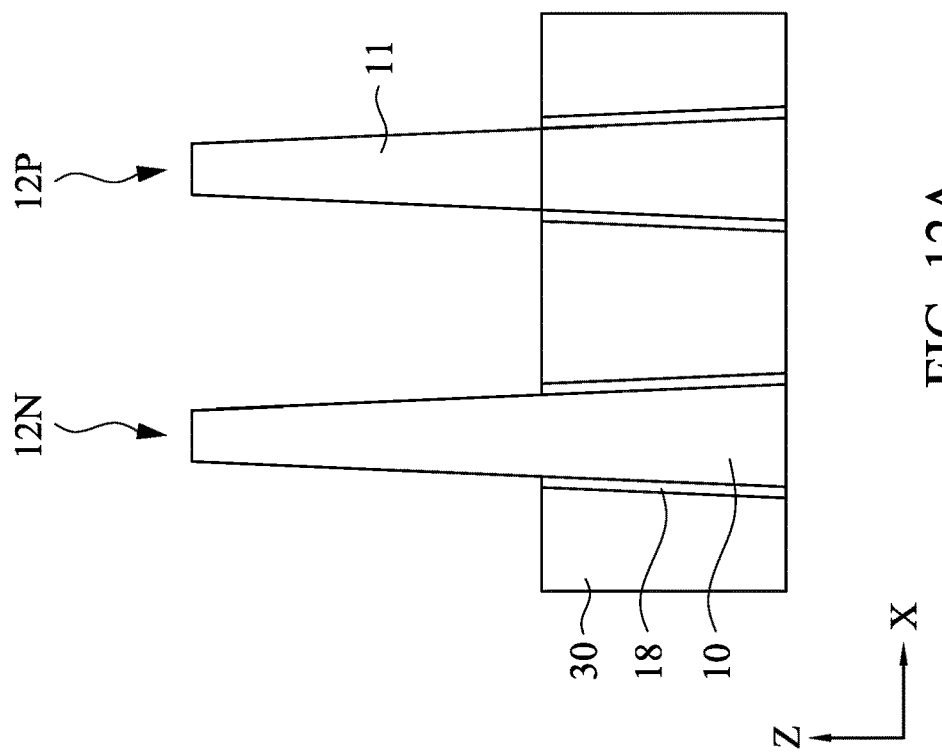

FIG. 12A shows a structure after the channel regions are exposed by recessing the first dielectric layer 30. For the purpose of illustration, one n-type fin structure 12N and one p-type fin structure 12P are shown in FIGS. 12A-12C.

In some embodiments, after the isolation insulating layer 30 is formed at S101 of FIG. 13, one or more wet cleaning operations are performed in some embodiments. In some embodiments, a thin oxide layer formed on the channel region of the fin structures 12 is removed. In some embodiments, the channel region of the fin structure exposed from the isolation insulating layer is also slightly etched.

Then, at S102 of FIG. 13, in some embodiments, the channel region of the fin structures 12N, 12P are trimmed (etched), as shown in FIG. 12B. In some embodiments, one or more dry etching and/or wet etching are performed. In some embodiments, a wet etching using a tetramethylammonium hydroxide (TMAH) aqueous solution and/or a KOH aqueous solution is used as a wet etchant. In other embodiments, a chemical dry etching using an HCl gas is used to trim the channel region. In some embodiments, a trimming (etching) amount is in a range from about 0.2 nm to about 2.0 nm and is in a range from about 0.5 nm to about 1.0 nm in other embodiments.

Figure 12D:
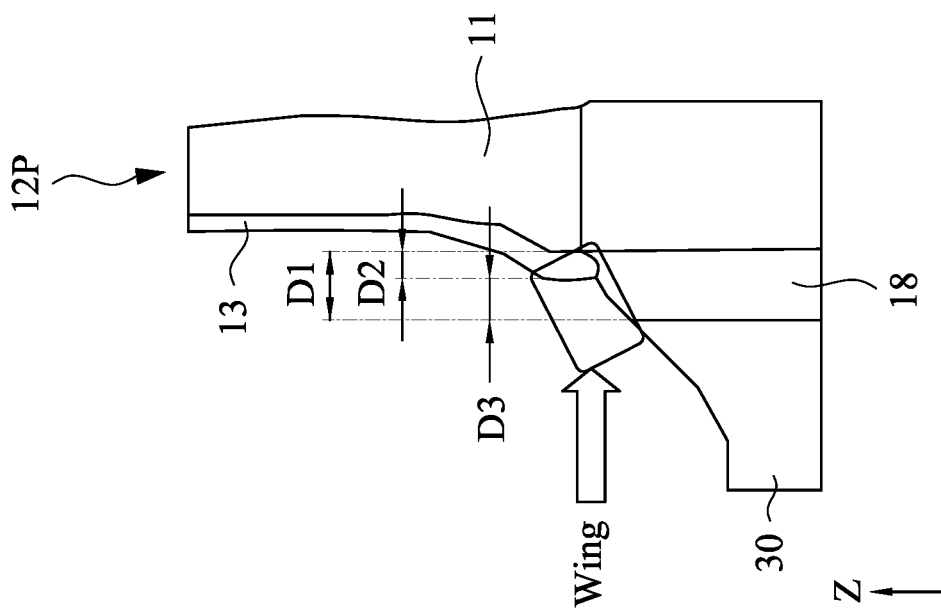
Figure 12C:
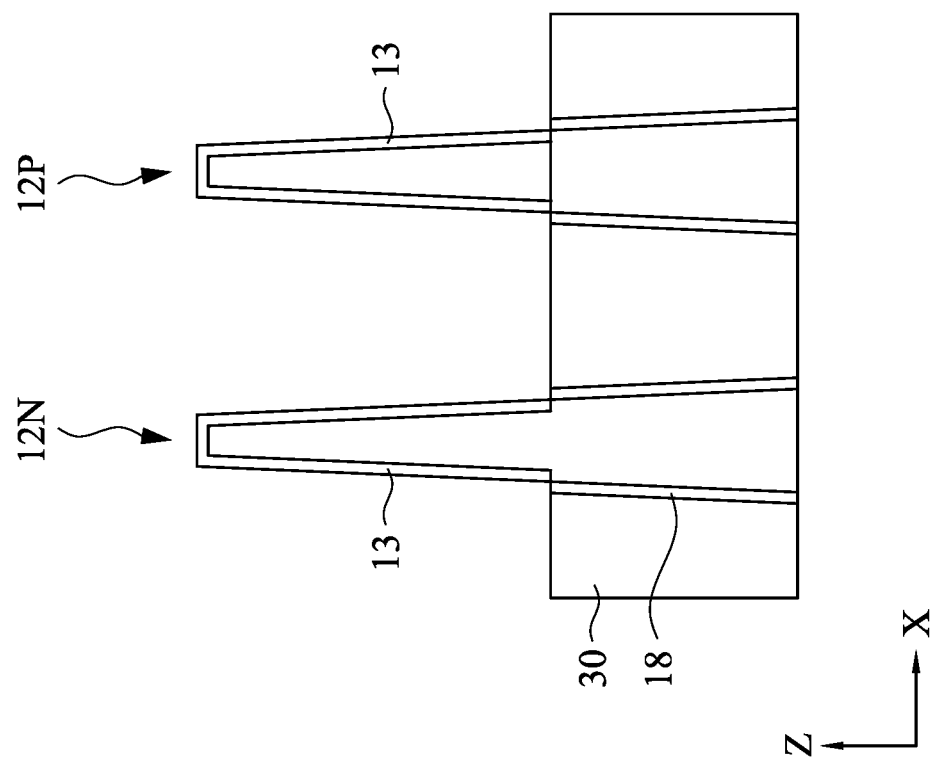
Figure 13:
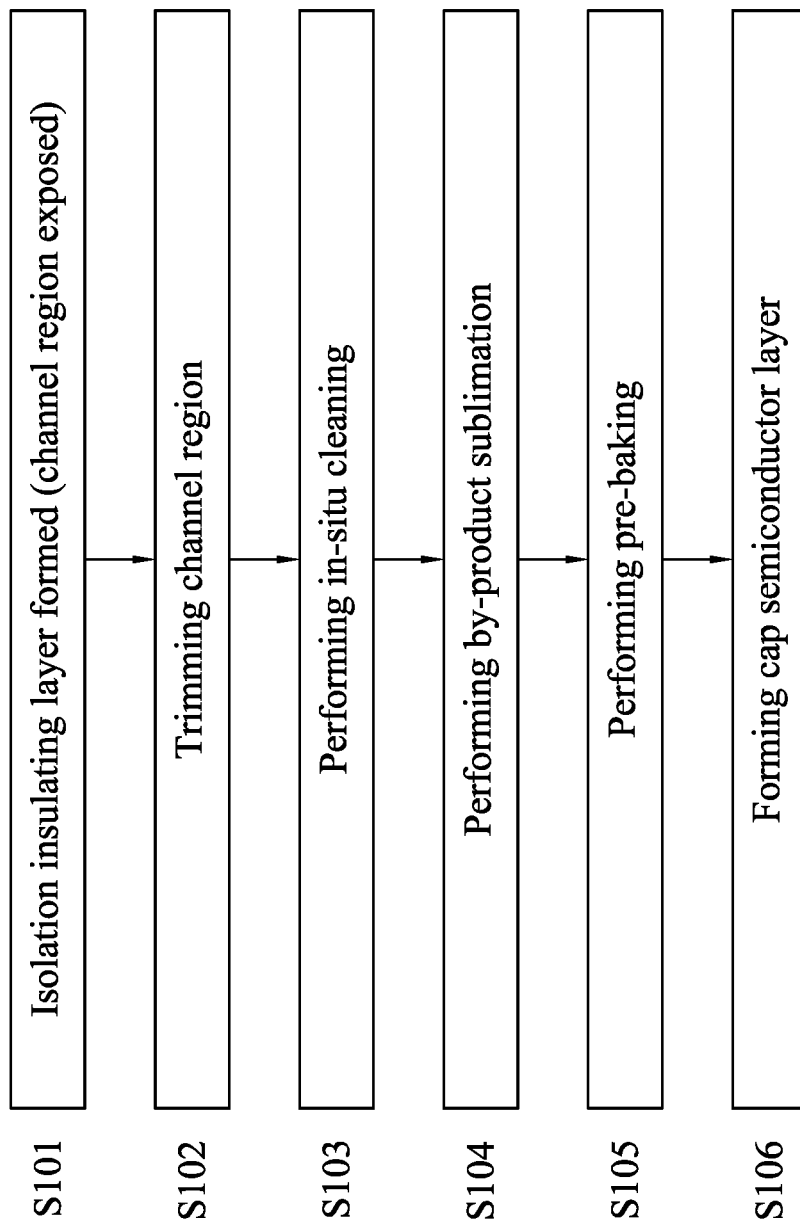
FIG. 13 shows a flow chart of forming a cap semiconductor layer according to an embodiment of the present disclosure.

After the trimming etching, in some embodiments, a cap semiconductor layer 13 is formed over the channel region of the n-type fin structure 12N and the channel region 11 of the p-type fin structure 12P, as shown in FIG. 12C.

In some embodiments, the cap semiconductor layer 13 includes silicon, SiGe or Ge. In certain embodiments, silicon is used. The cap semiconductor layer 13 is formed over the fin structures to adjust dimensions (widths) of the fin structures and also control out-diffusion of Ge from SiGe or Ge layers of the p-type fin structures. In some embodiments, the thickness of the cap semiconductor layer 13 (measured at the 50% height of the channel region) is in a range from about 0.2 nm to about 4 nm and is in a range from about 0.5 nm to about 2 nm in other embodiments, depending on device and/or process requirements.

In some embodiments, the cap semiconductor layer 13 is epitaxially-grown over the channel regions. In some embodiments, the epitaxial layer is substantially selectively formed on the channel regions. In some embodiments, the cap semiconductor layer 13 is non-doped and in other embodiments, the cap semiconductor layer 13 is appropriately doped for the n-type fin structures 12N and p-type fin structures 12P.

In some embodiments of the present disclosure, just before the cap semiconductor layer 13 is epitaxially formed, a cleaning operation is performed to remove an oxide layer formed in or after the trimming process, at S103 of FIG. 13. In some embodiments of the present disclosure, the selectivity of the epitaxial growth of the cap semiconductor layer 13 depends on conditions and/or processes of the cleaning operation.

Figure 14:
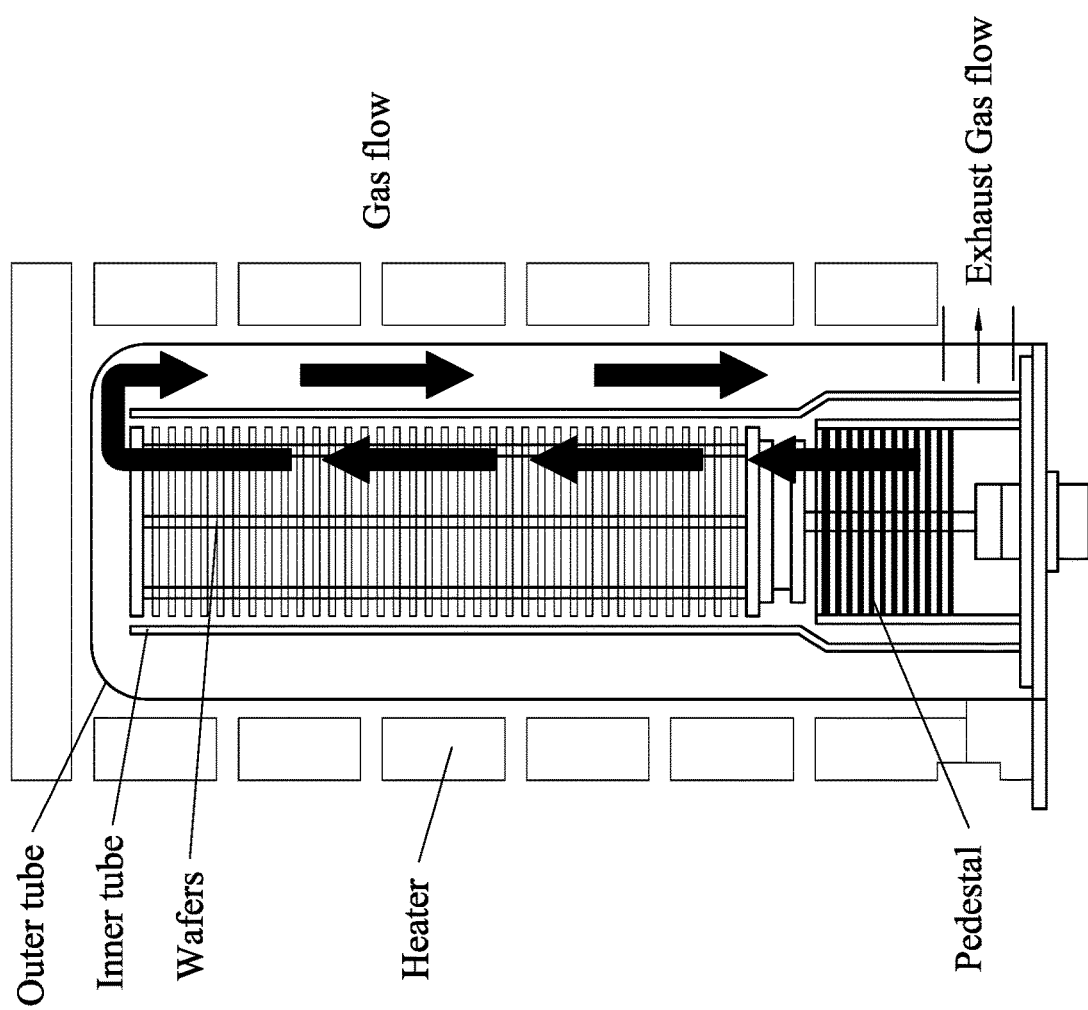
FIG. 14 shows an apparatus used for manufacturing a semiconductor device according to an embodiment of the present disclosure.

In some embodiments of the present disclosure, the cleaning operation and the epitaxial growth operation are performed in a same process chamber (e.g., vacuum chamber or a furnace) (in-situ cleaning). In some embodiments, a furnace shown in FIG. 14 is used for the cleaning operation and the epitaxial growth operation. As shown in FIG. 14, the furnace includes an outer tube and an inner tube and wafers are arranged vertically inside the inner tube and are supported and moved vertically by pedestal. A reaction gas flows from the bottom of the inner tube and flows down from the top of the inner tube to the exhaust through the space between the inner tube and the outer tube. The furnace is heated by the heaters disposed outside the outer tube. Multiple wafers (e.g., 25-100 wafers) can be processed at the same time in the furnace.

In some embodiments, the cleaning operation is a chemical dry etching using a mixed gas of HF, $NH_3$ and $N_2$. In some embodiments, a flow rate ratio of HF, $NH_3$ and $N_2$ is about 1:1:2.75 to about 5:1:6.5. In some embodiments, no noble gas (He, Ar) is added. In some embodiments, no hydrogen gas is added. The cleaning or removal of silicon oxide by HF and $NH_3$ proceeds as follows: $SiO_2$+ $4HF \rightarrow SiF_4 + 2H_2O$; $SiF_4 + 2HF + 2NH_3 \rightarrow (NH_4)_2SiF_6$; and $SiO_2 + 6HF + 2NH_3 \rightarrow (NH_4)_2SiF_6$. Compared to a chemical dry etching using a mixed gas of HF, $NH_3$ and He, (so called SiCoNi process), the chemical dry etching using a mixed gas of HF, $NH_3$ and $N_2$ etches silicon oxide (oxide on the channel region and isolation insulating layer 30) and silicon nitride (liner dielectric layer 18) more equally than the SiCoNi process, which affects the selectivity of the epitaxial growth. In some embodiments, an etching selectivity of the isolation insulating layer 30 (e.g., silicon oxide) to the liner dielectric layer (e.g., silicon nitride) is about 1.4 when using the mixed gas of HF, $NH_3$ and $N_2$ etches, while the etching selectivity is about 3.5 when the SiCoNi process is used.

In some embodiments, the amount of HF and $NH_3$ (etchant gas) with respect to the total mixed gas is equal to or more than 30 vol % to equal to or less than 80 vol %, and in other embodiments, in a range from about 40 vol % to about 60 vol %. If the amount of etchant gas is smaller than this range, the cleaning effect is insufficient and if the amount of the etchant gas is greater than this range, quartz parts of the furnace may be damaged. In some embodiments, the pressure during the chemical dry etching is about 0.1 Torr to about 0.5 Torr.

Figure 15:
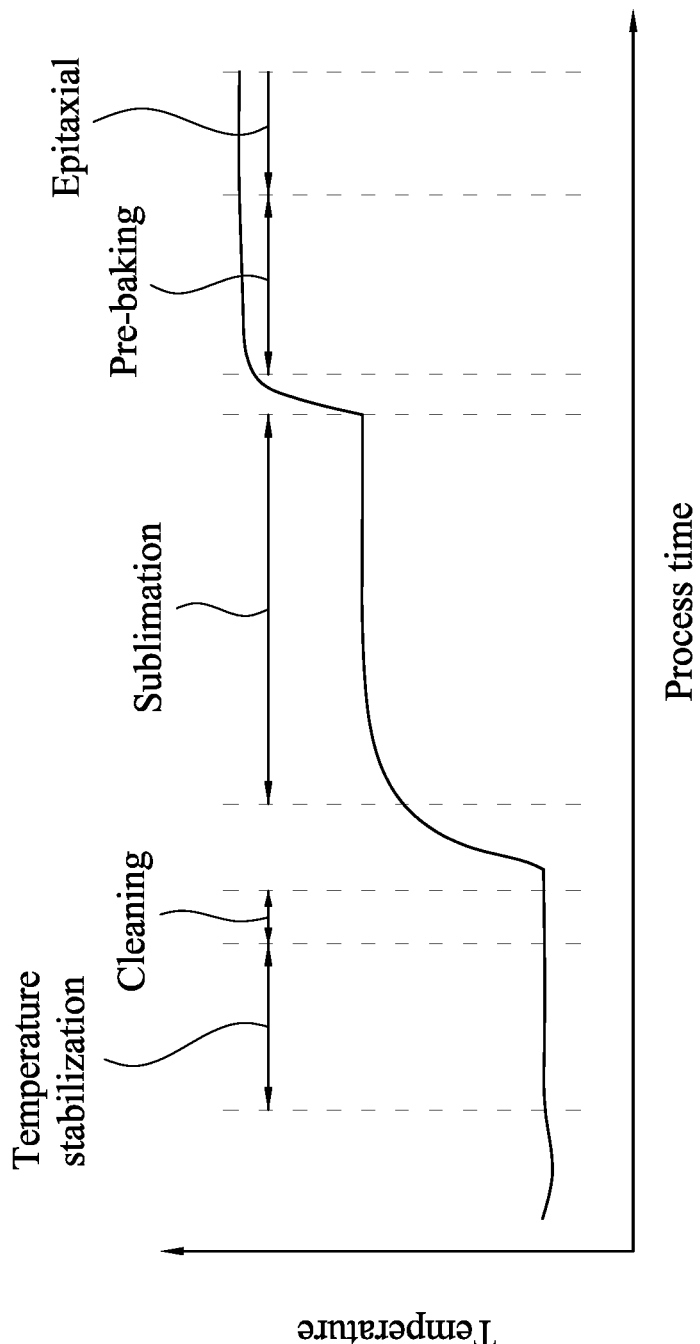
FIG. 15 shows a condition of cleaning and forming an epitaxial layer according to an embodiment of the present disclosure.

FIG. 15 shows a temperature change from the cleaning operation to the epitaxial growth. In some embodiments, a temperature of the cleaning operation is in a range from about 30° C. to about 100° C., and is in a range from about 40° C. to about 70° C. in other embodiments. If the temperature is lower than the disclosed ranges, the cleaning effect is insufficient and if the temperature is higher than the disclosed ranges, the removal of oxide may decrease (higher selective etching). A time duration of the cleaning operation is in a range from about 1 min to 60 min in some embodiments and is in a range from about 5 min to about 15 min in other embodiments. When the cleaning time is too small, the cleaning effect is insufficient, and when the cleaning time to too long, the dielectric or insulating layers may be etched too much.

After the cleaning operation by the chemical dry etching, at S104 of FIG. 13, the etching byproduct (e.g., $(NH_4)_2SiF_6$) is removed by a heating process in a $H_2$ ambient (e.g., sublimation process: $(NH_4)_2SiF_6 \rightarrow SiF_4 + 2HF + 2NH_3$). The temperature of the sublimation process is in a range from about 250° C. to about 350° C. in some embodiments. A time duration of the sublimation process is in a range from about 1 hour to 5 hours in some embodiments.

After the sublimation process, a pre-baking process is performed in a $H_2$ ambient at S105 of FIG. 13. In some embodiments, the temperature of the pre-baking process is higher than the sublimation process. In some embodiments, the temperature of the pre-baking process is in a range from about 300° C. to about 650° C., and is in a range from about 350° C. to about 400° C. in other embodiments. In the pre-baking process, fluorine is removed. A time duration of the pre-baking operation is in a range from about 30 min to 3 hours in some embodiments. In some embodiments, the sublimation process and the pre-baking process are performed continuously at the same temperature.

After the pre-baking process, an epitaxial growth process is performed to form the cap semiconductor layer 13, at S106 of FIG. 13. In some embodiments, a source gas is one or more of $SiH_4$ or $Si_2H_6$. The temperature of the epitaxial growth process is in a range from about 300° C. to about 650° C. in some embodiments and is in a range from about 350° C. to about 400° C. in other embodiments. If the temperature is too high, uniformity of the film thickness decreases, Ge in the SiGe layer diffuses, and selectivity is lower, and if the temperature is too low, the growth rate is too low for mass production. In some embodiments, the temperature of the pre-baking is the same as or different from the temperature of the epitaxial growth.

FIG. 12D shows a cross section view after the cap semiconductor layer 13 is formed over the SiGe channel 11. As shown in FIG. 12D, the amount of the cap semiconductor layer 13 on the liner dielectric layer 18 (a wing portion) is minimized. In some embodiments, the cap semiconductor layer 13 does not extend over the isolation insulating layer 30. In some embodiments, the surface area D3 of the liner dielectric layer 18 not covered by the cap semiconductor layer 13 is about 20% to 90% of the thickness liner dielectric layer 18, and thus the thickness of the cap semiconductor layer 13 on the liner dielectric layer 18 (the wing portion) is about 10% to about 80% of the thickness D1 (D1, D2 and D3 are measured in the horizontal direction (projected onto the horizontal plane)). In other embodiments, D3 is about 40% to 70% of D1 (thickness of the cap semiconductor layer 13 on the liner dielectric layer 18 (the wing portion) is about 30% to about 60% of the thickness D1). In some embodiments, the dimension D1 is defined as a distance of e.g., 2.7 nm (the right line defining D1) from the outer side face (the let line defining D1, interface between the liner dielectric layer 18 and the isolation insulating layer 30), and the thickness D2 of the cap semiconductor layer 13 is largest point of the cap semiconductor layer 13 from the right line defining D1. In some embodiments, the D2 (wing width) is about 1.3 nm to about 2.3 nm. When the SiCoNi process and/or ex-situ cleaning process are used, the cap semiconductor layer 13 fully covers the liner dielectric layer and may be formed over the isolation insulating layer beyond the liner dielectric layer 18. When the wing portion is larger, electrical properties of the FinFET (e.g., drain induced barrier lowering (DIBL)) become worse. In some embodiments, the thickness of the cap semiconductor layer 13 just on the liner dielectric layer 18 is greater than the thickness of the cap semiconductor layer 13 at the middle of the channel region (e.g., 50% of height of the channel region).

As set forth above, the cleaning operation, the sublimation process, the pre-baking process and the epitaxial growth are continuously performed in the same chamber (furnace) without breaking vacuum. In some embodiments, the operations of FIG. 13 is repeated twice or three times to obtain desired channel shape.

Although FIG. 12D shows a p-type fin structure (SiGe channel), the same or similar structure can be obtained for an n-type fin structure (Si channel).

After the cap semiconductor layer 13 is formed, an annealing operation is performed in some embodiments. In some embodiments, the annealing operation includes rapid thermal annealing at a temperature in a range from about 900° C. to about 1100° C. for about 0.1 sec to 10 sec. In other embodiments, the temperature is in a range from about 950° C. to 1050° C. In other embodiments, the time duration is in a range from about 0.5 sec to 5 sec. In some embodiments, the annealing operation is performed in a mixed gas of $N_2$ and $O_2$, where the oxygen concentration is in a range from about 0.1% to 0.5%. The annealing operation is also performed in the same chamber (furnace) in some embodiments.

FIGS. 16A-16F show various stages of a sequential manufacturing operation of a semiconductor FET device according to an embodiment of the present disclosure. It is understood that additional operations may be provided before, during, and after the processes shown by FIGS. 16A-16F, and some of the operations described below can be replaced or eliminated for additional embodiments of the method. The order of the operations/processes may be interchangeable.

Figure 16A:
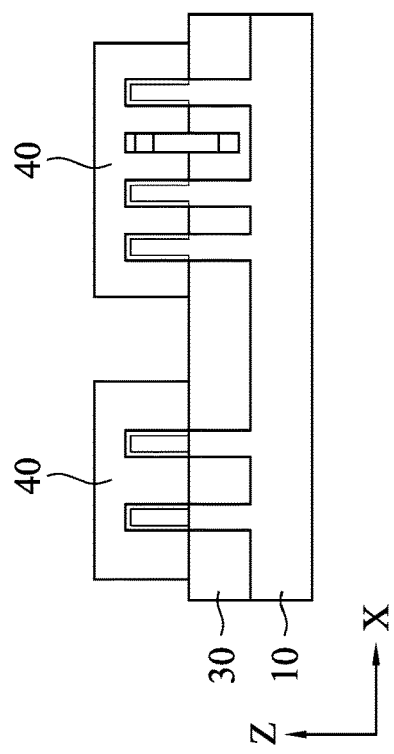
FIGS. 16A, 16B, 16C, 16D, 16E and 16F show various stages of a sequential manufacturing operation of a semiconductor FET device according to an embodiment of the present disclosure.

FIG. 16A shows the structure after the cap semiconductor layer 13 is formed over both p-type fin structures 12P and n-type fin structures 12N. Substantially no cap semiconductor layer is formed over a surface of insulating material, such as the surface of the isolation insulating layer 30 and a wall fin structure 50.

Figure 16B:
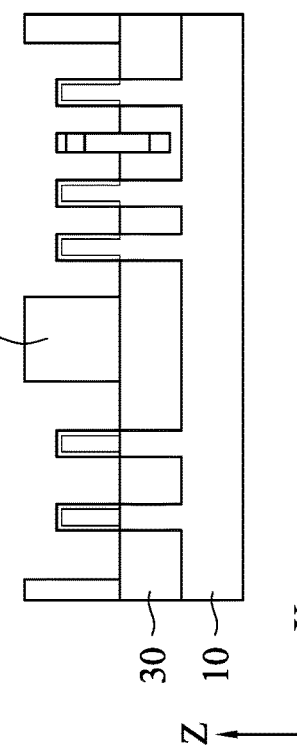

After the cap semiconductor layer 13 is formed as shown in FIGS. 12A-12D, sacrificial gate structures 40 are formed over the fin structures, as shown in FIG. 16B. In some embodiments, the sacrificial gate structures 40 include a sacrificial dielectric layer, a sacrificial gate electrode layer and a hard mask layer. The sacrificial gate dielectric layer includes one or more layers of insulating material, such as a silicon oxide-based material. In one embodiment, silicon oxide formed by CVD is used. The thickness of the sacrificial gate dielectric layer is in a range from about 1 nm to about 5 nm in some embodiments. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. The hard mask layer is used to form the sacrificial gate electrode layer and includes one or more layers of silicon nitride and silicon oxide. In some embodiments, the sacrificial gate dielectric layer also covers the source/drain region of the fin structures 12P, 12N.

After the sacrificial gate structures 40 are formed, a blanket layer of an insulating material for sidewall spacers is conformally formed by using CVD or other suitable methods. The blanket layer is deposited in a conformal manner so that it has substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof. The sidewall spacers are formed on opposite sidewalls of the sacrificial gate structures 40.

In the embodiment of FIG. 16B, one sacrificial gate structure 40 is disposed over two fin structures 12P in the p-type region, and one sacrificial gate structure 40 is disposed over three fin structures 12N and the wall fin structure 50 in the n-type region. However, the number of the fin structures per sacrificial gate structure is not limited, and can be one, two, three or more than four.

Subsequently, a source/drain epitaxial layer 62 and 64 is formed (see, FIG. 16F). In some embodiments, the fin structures of source/drain regions are recessed down below the upper surface of the isolation insulating layer 30 by using dry etching and/or wet etching, and then one or more semiconductor layers are epitaxially formed over the recessed fin structures. In other embodiments, one or more semiconductor layers are epitaxially formed over the source/drain region of the non-recessed fin structure. The source/drain epitaxial layer 62 for an n-type FET includes one or more layers of SiC, SiP and SiCP, and the source/drain epitaxial layer 64 for a p-type FET includes one or more layers of SiGe, SiGeSn, which may be doped with B. In at least one embodiment, the epitaxial layers are epitaxially-grown by an LPCVD process, molecular beam epitaxy, atomic layer deposition or any other suitable method. The LPCVD process is performed at a temperature of about 400° C. to about 850° C. and under a pressure of about 1 Torr to about 200 Torr, using a silicon source gas such as $SiH_4$, $Si_2H_6$, or $Si_3H_8$; a germanium source gas such as $GeH_4$ or $G_2H_6$; a carbon source gas such as $CH_4$ or $SiH_3CH_3$; a phosphorus source gas such as $PH_3$; and/or a boron source gas such as $B_2H_6$. In some embodiments, two or more layers with different compositions (e.g., different P, C, Ge and/or B concentrations) are formed as the source/drain epitaxial layers.

Figure 16C:
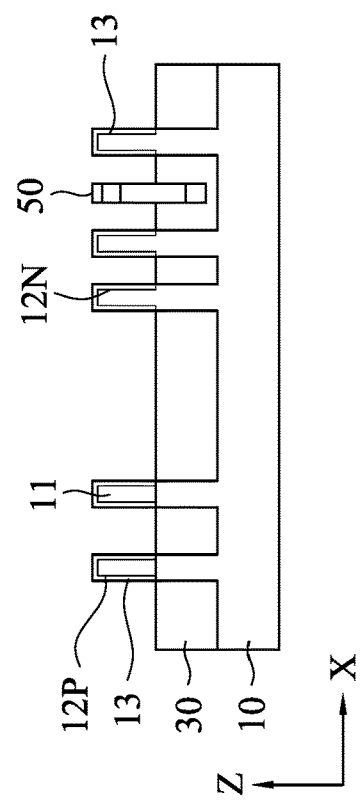

Subsequently, a first interlayer dielectric (ILD) layer 55 is formed over the source/drain epitaxial layers and the sacrificial gate structures 40, as shown in FIG. 16C. Then, a planarization operation, such as CMP, is performed, so that the top portion of the sacrificial gate electrode layer is exposed. The materials for the first ILD layer 55 include compounds comprising Si, O, C and/or H, such as silicon oxide, SiCOH and SiOC. Organic materials, such as polymers, may be used for the first ILD layer 55.

Figure 16D:
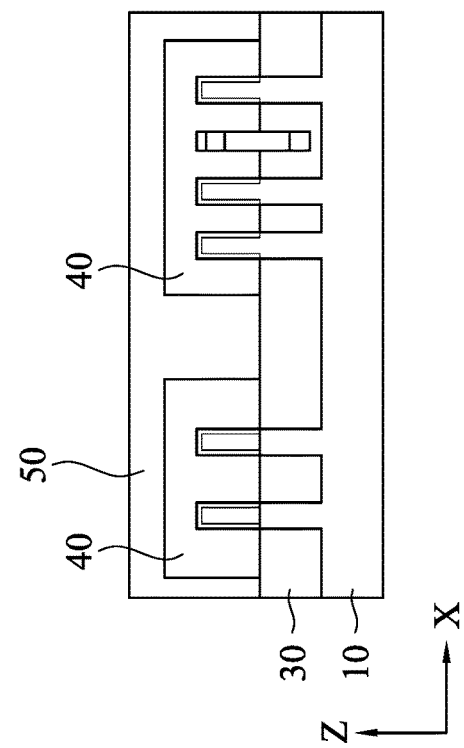

Next, the sacrificial structure 40 including sacrificial gate electrode layer and the sacrificial gate dielectric layer are removed, thereby exposing the upper portions (channel regions) of the fin structures, as shown in FIG. 16D. The sacrificial gate structures 40 can be removed using plasma dry etching and/or wet etching. When the sacrificial gate electrode layer is polysilicon and the first ILD layer 55 is silicon oxide, a wet etchant such as a TMAH solution can be used to selectively remove the sacrificial gate electrode layer. The sacrificial gate dielectric layer is thereafter removed using plasma dry etching and/or wet etching.

Figure 16F:
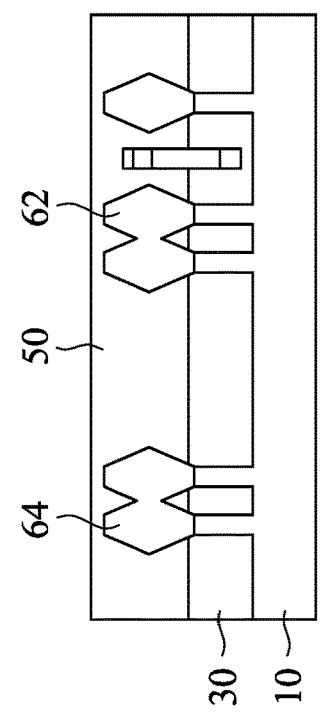
Figure 16E:
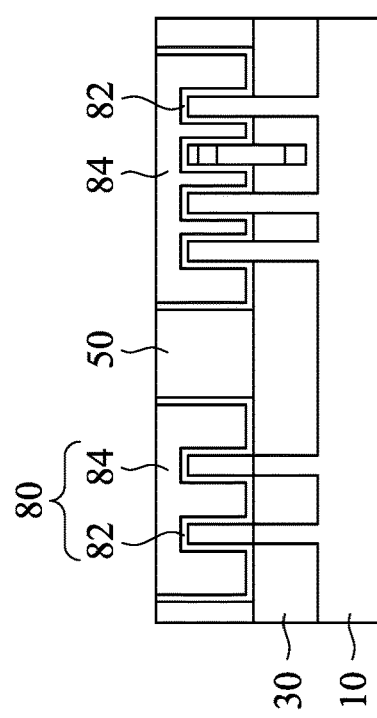

After the sacrificial gate structures are removed, a gate dielectric layer 82 is formed over channel regions (upper portions of the fin structure above the isolation insulating layer 30), and a gate electrode layer 84 is formed on the gate dielectric layer 82, as shown in FIG. 16E.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness over each channel layers. The thickness of the gate dielectric layer 82 is in a range from about 1 nm to about 6 nm in one embodiment.

The gate electrode layer 84 is formed on the gate dielectric layer 82. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the first ILD layer 55. The gate dielectric layer and the gate electrode layer formed over the first ILD layer 55 are then planarized by using, for example, CMP, until the top surface of the first ILD layer 55 is revealed. In some embodiments, after the planarization operation, the gate electrode layer 84 is recessed and a cap insulating layer is formed over the recessed gate electrode 84. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

It is understood that the semiconductor device shown in FIGS. 16E and 16F undergoes further CMOS processes to form various features such as contacts/vias, interconnect metal layers, dielectric layers, passivation layers, etc.

Figure 17A:
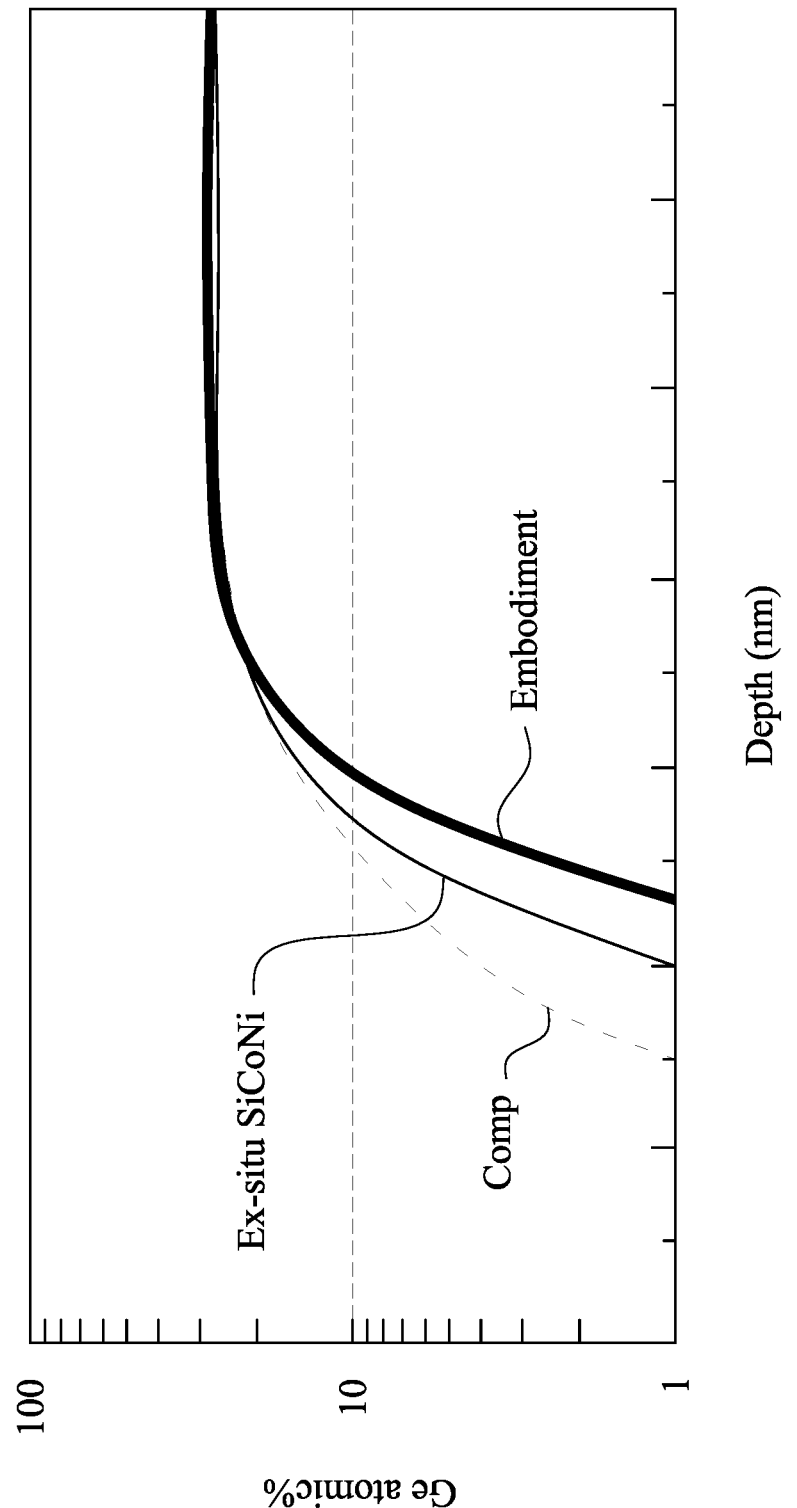
FIGS. 17A and 17B show advantageous effects of the embodiments of the present disclosure.
Figure 17B:
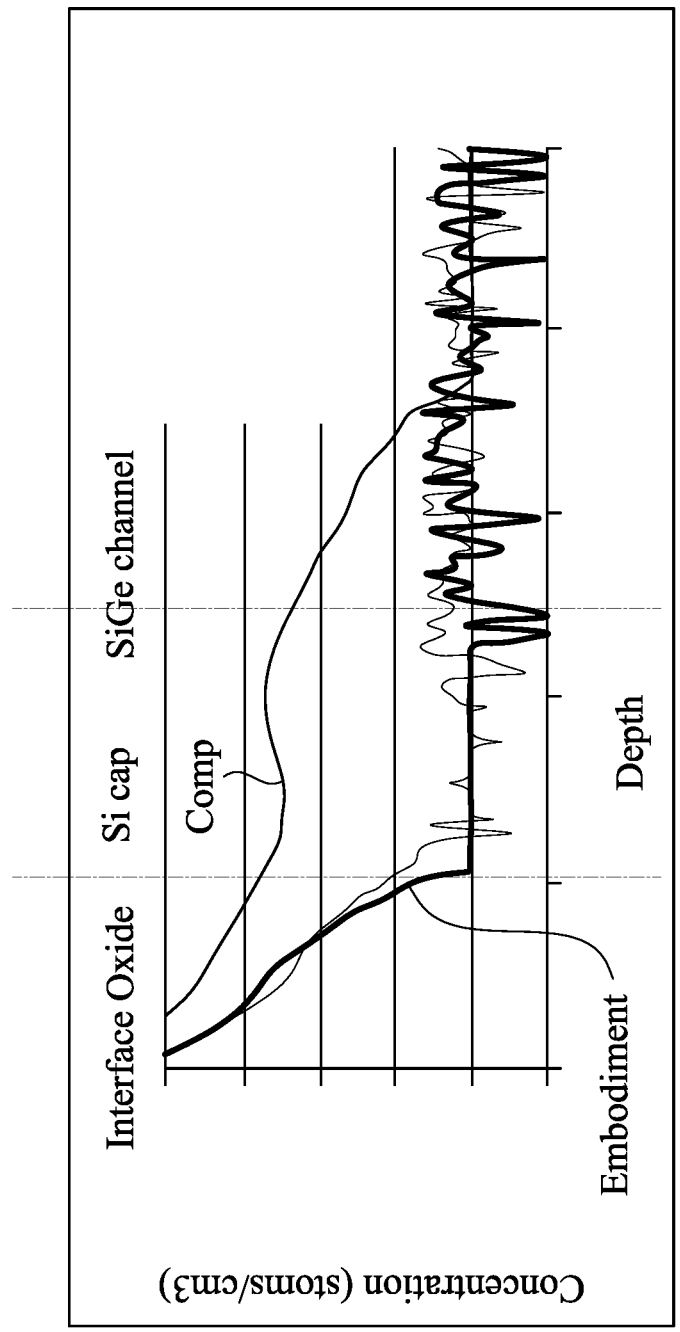

FIGS. 17A and 17B show advantageous effects of the present embodiments. FIG. 17A shows a Ge concentration from the surface of the cap semiconductor layer in a p-type fin structure. In the present embodiments, a steep slope in the Ge concentration was observed, which means that undesired Ge diffusion from the SiGe layer 11 to the cap semiconductor layer (Si) was effectively suppressed. In some embodiments, the diffusion can be suppressed by about 1.5-2.5 nm. Further, as shown in FIG. 17B, in the present embodiments, oxygen contamination into the channel region was suppressed. In some embodiments, the concentration of oxygen is smaller than about $1\times10^{18}$ atoms/cm$^3$. In some embodiments, the concentration of oxygen is smaller than the detection limit or more than about $1\times10^{16}$ atoms/cm$^3$.

Figure 18A:
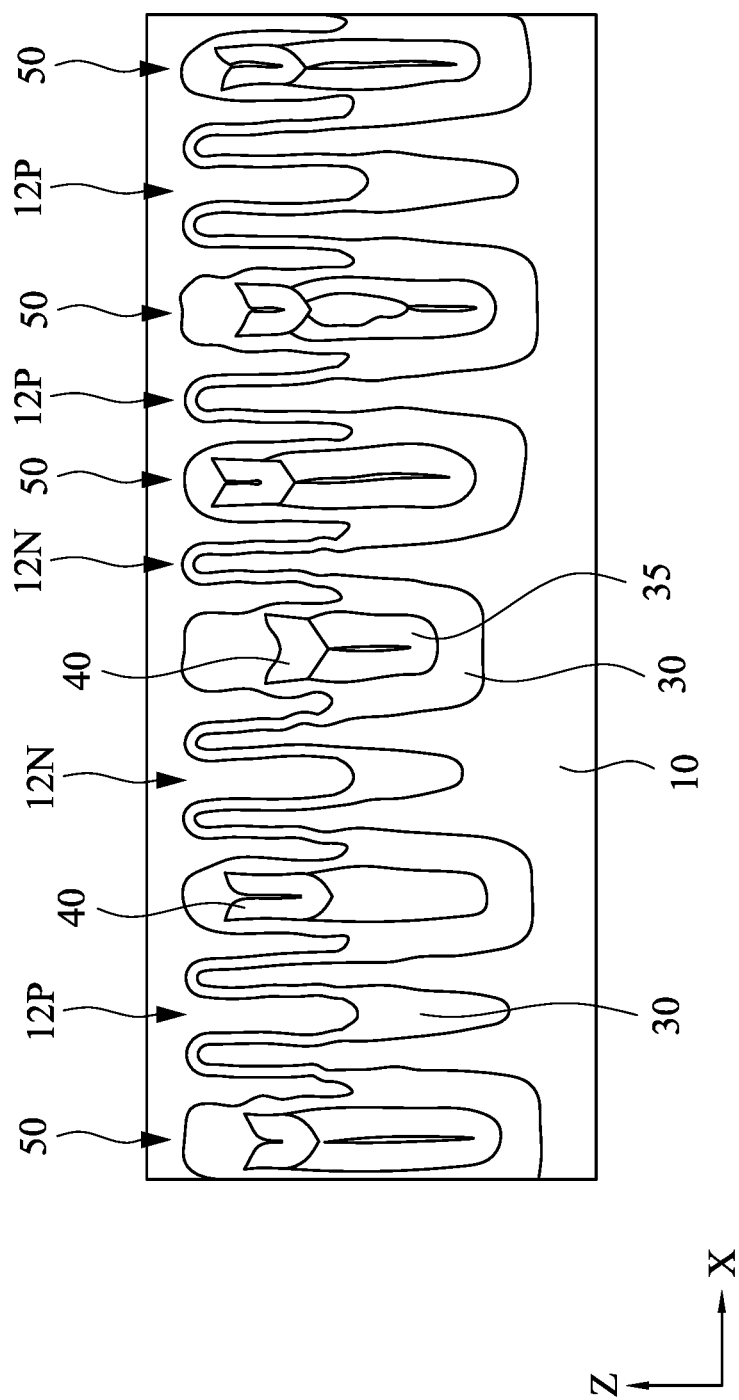
FIGS. 18A and 18B show cross sectional views of the semiconductor device according to embodiments of the present disclosure.
Figure 18B:
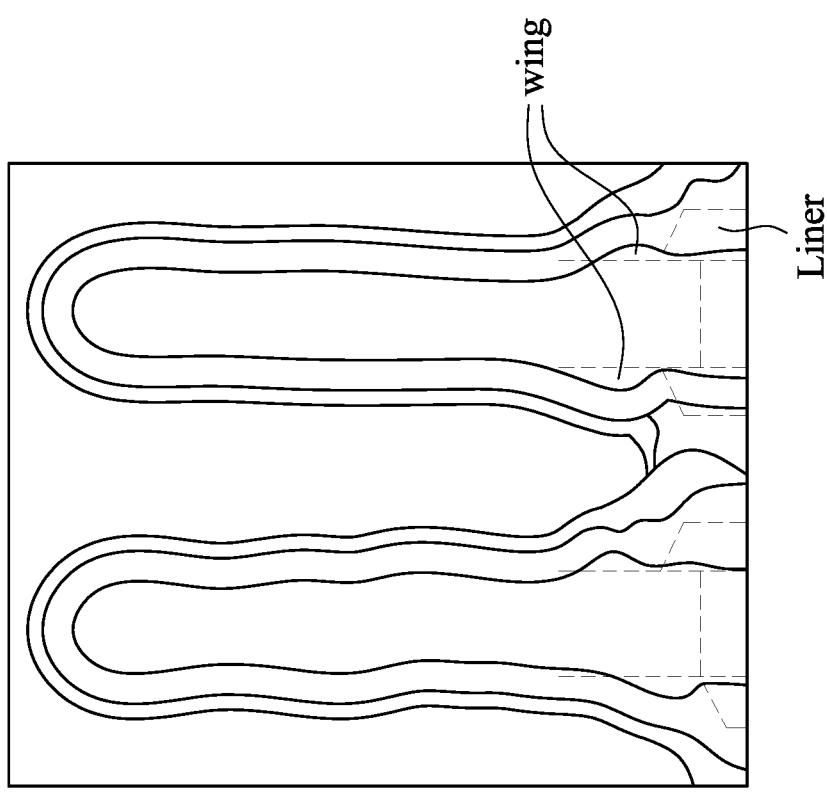

FIGS. 18A and 18B show cross sectional views of the semiconductor device according to embodiments of the present disclosure.

As shown in FIG. 18A, a wall fin structure 50 is disposed between fin structures where a space therebetween is sufficiently large, while no wall fin structure is disposed between fin structures where a space therebetween is sufficiently small. In some embodiments, the channel region of the fin structure bends and does not have uniform width depending on device performance requirements. In some embodiments, widths of the wall fin structure are greater than the widths of the semiconductor fin structures and different from each other. The height of the top of the third dielectric layer 40 differs from each other depending on space widths between adjacent fin structures. The height of the bottom of the third dielectric layer 40 differs from each other depending on space widths between adjacent fin structures.

As shown in FIG. 18B, the wing portions of the cap semiconductor layer 13 are formed asymmetric with respect to the center of the fin structure. In some embodiments, the lateral protruding amounts of the wing portions to the right and the left are different from each other. In some embodiments, the height of the maximum protruding portion of the wing portions are different from each other.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure having a channel region protruding from an isolation insulating layer disposed over a semiconductor substrate is formed, a cleaning operation is performed, and an epitaxial semiconductor layer is formed over the channel region. The cleaning operation and the forming the epitaxial semiconductor layer are performed in a same chamber without breaking vacuum. In one or more of the foregoing or the following embodiments, the cleaning operation is a chemical dry etching using a mixed gas of HF, NH$_3$ and N$_2$. In one or more of the foregoing or the following embodiments, the cleaning operation is performed at a temperature in a range from 30° C. to 100° C. In one or more of the foregoing or the following embodiments, the cleaning operation is performed for a time duration in a range from 5 min to about 15 min. In one or more of the foregoing or the following embodiments, a sublimation operation is further performed between the cleaning operation and the forming the epitaxial semiconductor to remove by-products of the cleaning operation. In one or more of the foregoing or the following embodiments, the sublimation operation is performed at a temperature higher than the cleaning operation and lower than the epitaxial growth. In one or more of the foregoing or the following embodiments, the sublimation operation is performed in a H$_2$ ambient.

In accordance with another aspect of the present disclosure, in a method of manufacturing a semiconductor device, a fin structure is formed. The fin structure has a channel region protruding from an isolation insulating layer disposed over a semiconductor substrate and a bottom region embedded in the isolation insulating layer. The channel region is made of SiGe and the bottom region is made of Si, a liner dielectric layer is disposed between the bottom region and the isolation insulating layer, and a top of the liner dielectric layer is exposed from the isolation insulating layer. A cleaning operation is performed on the channel region, the isolation insulating layer and the liner dielectric layer, and an epitaxial semiconductor layer is formed over the channel region. The cleaning operation and the forming the epitaxial semiconductor layer are performed in a same chamber without breaking vacuum. In one or more of the foregoing or the following embodiments, the epitaxial semiconductor layer only partially covers the exposed top of the liner dielectric layer. In one or more of the foregoing or the following embodiments, a thickness of the epitaxial semiconductor on the liner dielectric layer is 10% to 80% of a thickness of the liner dielectric layer at the top of the liner dielectric layer. In one or more of the foregoing or the following embodiments, the epitaxial semiconductor layer is a Si layer. In one or more of the foregoing or the following embodiments, the liner dielectric layer includes silicon nitride, and the isolation insulating layer includes silicon oxide. In one or more of the foregoing or the following embodiments, the forming the epitaxial semiconductor layer is performed at a temperature in a range from 350° C. to 400° C. In one or more of the foregoing or the following embodiments, the cleaning operation is a chemical dry etching using a mixed gas of HF, $NH_3$ and $N_2$, at a temperature in a range from 40° C. to 70° C. In one or more of the foregoing or the following embodiments, no noble gas is added to the mixed gas. In one or more of the foregoing or the following embodiments, the chamber is a furnace in which multiple substrate are processed at the same time.

In accordance with another aspect of the present disclosure, in a method of manufacturing a semiconductor device, a first dielectric layer is formed over a first pair of semiconductor fins and a second pair of semiconductor fins such that the first dielectric layer fills a space between the second pair of semiconductor fins. A second dielectric layer is formed over the first dielectric layer such that the second dielectric layer fills a space between the first pair of semiconductor fins. The second dielectric layer is recessed below a top of each of the first pair of semiconductor fins. A third dielectric layer is formed over the recessed second dielectric layer. The third dielectric layer is recessed below the top of the first pair of semiconductor fins. A fourth dielectric layer is formed over the recessed third dielectric layer. The fourth dielectric layer and the first dielectric layer are recessed below the top of the first pair of semiconductor fins, thereby forming a wall fin disposed between the first pair of semiconductor fins. A cleaning operation is performed, and an epitaxial semiconductor layer is formed over channel regions of the first and second pairs of semiconductor fins. The cleaning operation and the forming the epitaxial semiconductor layer are performed in a same chamber without breaking vacuum. In one or more of the foregoing or the following embodiments, the wall fin comprises the recessed fourth dielectric layer, the recessed third dielectric layer and the recessed second dielectric layer disposed under the recessed third dielectric layer. In one or more of the foregoing or the following embodiments, no wall fin is formed between the second pair of semiconductor fins. In one or more of the foregoing or the following embodiments, the channel regions of the first pair of semiconductor fins are made of Si, and the channel regions of the second pair of semiconductor fins are made of SiGe.

In accordance with another aspect of the present disclosure, a semiconductor device includes a semiconductor fin disposed over a semiconductor substrate and extending in a first direction. The semiconductor fin includes a channel region and a bottom region on which the channel region is disposed. The semiconductor device includes a liner dielectric layer disposed on side walls of the bottom region, an isolation insulating layer from which the channel region protrudes and in which the bottom region is embedded, and a gate structure disposed over the channel region of the semiconductor fin and extending in a second direction crossing the first direction. A cap semiconductor layer is disposed on the channel region, and a top of the liner dielectric layer is only partially covered by the cap semiconductor layer. In one or more of the foregoing or the following embodiments, the channel region and the bottom region are made of different semiconductor materials from each other. In one or more of the foregoing or the following embodiments, the channel region is made of SiGe. In one or more of the foregoing or the following embodiments, the cap semiconductor layer is made of Si. In one or more of the foregoing or the following embodiments, a thickness of the cap semiconductor layer on the liner dielectric layer is 30% to 70% of a thickness of the liner dielectric layer at the top of the liner dielectric layer. In one or more of the foregoing or the following embodiments, the liner dielectric layer includes silicon nitride, and the isolation insulating layer includes silicon oxide. In one or more of the foregoing or the following embodiments, a thickness of the cap semiconductor layer on the liner dielectric layer is greater than a thickness of the cap semiconductor layer at a 50% height of the channel region. In one or more of the foregoing or the following embodiments, the channel region is made of Si, the cap semiconductor layer is made of Si, and a thickness of the cap semiconductor layer on the liner dielectric layer is 30% to 70% of a thickness of the liner dielectric layer at the top of the liner dielectric layer.

In accordance with another aspect of the present disclosure, a semiconductor device includes a first semiconductor fin and a second semiconductor fin disposed over a semiconductor substrate and extending in a first direction. Each of the first and second semiconductor fins includes a channel region and a bottom region on which the channel region is disposed. The semiconductor device includes a liner dielectric layer disposed on side walls of the bottom region of each of the first and second semiconductor fins, an isolation insulating layer from which the channel region of the first and second semiconductor fins protrudes and in which the bottom region of the first and second semiconductor fins is embedded, and a first gate structure disposed over the channel region of the first semiconductor fin and a second gate structure disposed over the channel region of the second semiconductor fin. A cap semiconductor layer is disposed on the channel region of each of the first and second semiconductor fins, and a top of the liner dielectric layer is only partially covered by the cap semiconductor layer at each of the first and second semiconductor fins. In one or more of the foregoing or the following embodiments, the cap semiconductor layer is made of Si. In one or more of the foregoing or the following embodiments, the channel region of the second semiconductor fin is made of SiGe. In one or more of the foregoing or the following embodiments, the channel region of the first semiconductor fin is made of Si. In one or more of the foregoing or the following embodiments, a thickness of the cap semiconductor layer of on the liner dielectric layer at the second semiconductor fin is 30% to 70% of a thickness of the liner dielectric layer at the top of the liner dielectric layer. In one or more of the foregoing or the following embodiments, the liner dielectric layer includes silicon nitride, and the isolation insulating layer includes silicon oxide. In one or more of the foregoing or the following embodiments, a thickness of the cap semiconductor layer on the liner dielectric layer is greater than a thickness of the cap semiconductor layer at a 50% height of the channel region. In one or more of the foregoing or the following embodiments, a wall fin structure made of at least three different dielectric material is disposed between the first semiconductor fin and the second semiconductor fin.

In accordance with another aspect of the present disclosure, a semiconductor device includes a first semiconductor fin and a second semiconductor fin disposed over a semiconductor substrate and extending in a first direction, an isolation insulating layer disposed between the first semiconductor fin and the second semiconductor fin, a wall fin extending in the first direction, wherein a lower portion of the wall fin is embedded in the isolation insulating layer and a upper portion of the wall fin protrudes from the isolation insulating layer, and a gate structure disposed over a channel region of the first semiconductor fin and a channel region of the second semiconductor fin and extending in a second direction crossing the first direction. Each of the first semiconductor fin and the second semiconductor fin includes the channel region and a bottom region embedded in the isolation insulating layer and a liner dielectric layer disposed between the isolation insulating layer and the bottom region, the channel region is made of SiGe and further includes a Si cap layer disposed over the SiGe channel region, and a top of the liner dielectric layer is only partially covered by the Si cap layer. In one or more of the foregoing or the following embodiments, a thickness of the Si cap layer on the liner dielectric layer is 30% to 70% of a thickness of the liner dielectric layer at the top of the liner dielectric layer. In one or more of the foregoing or the following embodiments, the liner dielectric layer includes silicon nitride, and the isolation insulating layer includes silicon oxide. In one or more of the foregoing or the following embodiments, the wall fin includes a lower dielectric layer and an upper dielectric layer disposed over the lower dielectric layer and made of a different material than the lower dielectric layer, and the upper dielectric layer includes includes at least one selected from the group consisting of $HfO_2$, HfSiO, HfSiON, HfTaO, HfSiO, HfZrO, zirconium oxide, aluminum oxide, titanium oxide, and a hafnium dioxide-alumina ($HfO_2$—$Al_2O_3$) alloy.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor fin disposed over a semiconductor substrate and extending in a first direction, the semiconductor fin including a channel region and a bottom region on which the channel region is disposed;
   a liner dielectric layer disposed on side walls of the bottom region;
   an isolation insulating layer from which the channel region protrudes and in which the bottom region is embedded; and
   a gate structure disposed over the channel region of the semiconductor fin and extending in a second direction crossing the first direction, wherein:
   a cap semiconductor layer is disposed on the channel region,
   a top of the liner dielectric layer is only partially covered by the cap semiconductor layer, and
   a thickness of the cap semiconductor layer on the liner dielectric layer is greater than a thickness of the cap semiconductor layer at a 50% height of the channel region.

2. The semiconductor device of claim 1, wherein the channel region and the bottom region are made of different semiconductor materials from each other.

3. The semiconductor device of claim 2, wherein the channel region is made of SiGe.

4. The semiconductor device of claim 3, wherein the cap semiconductor layer is made of Si.

5. The semiconductor device of claim 4, wherein a thickness of the cap semiconductor layer on the liner dielectric layer is 30% to 70% of a thickness of the liner dielectric layer at the top of the liner dielectric layer.

6. The semiconductor device of claim 4, wherein the liner dielectric layer includes silicon nitride, and the isolation insulating layer includes silicon oxide.

7. The semiconductor device of claim 4, wherein the cap semiconductor layer is an epitaxially formed Si.

8. The semiconductor device of claim 2, wherein:
   the channel region is made of Si,
   the cap semiconductor layer is made of Si, and
   a thickness of the cap semiconductor layer on the liner dielectric layer is 30% to 70% of a thickness of the liner dielectric layer at the top of the liner dielectric layer.

9. A semiconductor device comprising:
   a first semiconductor fin and a second semiconductor fin disposed over a semiconductor substrate and extending in a first direction, each of the first and second semiconductor fins including a channel region and a bottom region on which the channel region is disposed;
   a liner dielectric layer disposed on side walls of the bottom region of each of the first and second semiconductor fins;
   an isolation insulating layer from which the channel region of the first and second semiconductor fins protrudes and in which the bottom region of the first and second semiconductor fins is embedded; and
   a first gate structure disposed over the channel region of the first semiconductor fin and a second gate structure disposed over the channel region of the second semiconductor fin, wherein:
   a cap semiconductor layer is an epitaxially formed layer and disposed on the channel region of each of the first and second semiconductor fins, and
   a top of the liner dielectric layer is only partially covered by the cap semiconductor layer at each of the first and second semiconductor fins.

10. The semiconductor device of claim 9, wherein the cap semiconductor layer is made of Si.

11. The semiconductor device of claim 10, wherein the channel region of the second semiconductor fin is made of SiGe.

12. The semiconductor device of claim 11, wherein the channel region of the first semiconductor fin is made of Si.

13. The semiconductor device of claim 11, wherein a thickness of the cap semiconductor layer of on the liner dielectric layer at the second semiconductor fin is 30% to 70% of a thickness of the liner dielectric layer at the top of the liner dielectric layer.

14. The semiconductor device of claim 11, wherein the liner dielectric layer includes silicon nitride, and the isolation insulating layer includes silicon oxide.

15. The semiconductor device of claim 11, wherein a thickness of the cap semiconductor layer on the liner dielectric layer is greater than a thickness of the cap semiconductor layer at a 50% height of the channel region.

16. The semiconductor device of claim 11, wherein a wall fin structure made of at least three different dielectric materials is disposed between the first semiconductor fin and the second semiconductor fin.

17. A semiconductor device comprising:
a first semiconductor fin and a second semiconductor fin disposed over a semiconductor substrate and extending in a first direction;
an isolation insulating layer disposed between the first semiconductor fin and the second semiconductor fin;
a wall fin extending in the first direction, wherein a lower portion of the wall fin is embedded in the isolation insulating layer and an upper portion of the wall fin protrudes from the isolation insulating layer; and
a gate structure disposed over a channel region of the first semiconductor fin and a channel region of the second semiconductor fin and extending in a second direction crossing the first direction, wherein:
each of the first semiconductor fin and the second semiconductor fin includes the channel region and a bottom region embedded in the isolation insulating layer and a liner dielectric layer disposed between the isolation insulating layer and the bottom region,
the channel region is made of SiGe and further includes a Si cap layer disposed over the SiGe channel region, and
a top of the liner dielectric layer is only partially covered by the Si cap layer.

18. The semiconductor device of claim 17, wherein a thickness of the Si cap layer on the liner dielectric layer is 30% to 70% of a thickness of the liner dielectric layer at the top of the liner dielectric layer.

19. The semiconductor device of claim 18, wherein the liner dielectric layer includes silicon nitride, and the isolation insulating layer includes silicon oxide.

20. The semiconductor device of claim 17, wherein:
the wall fin includes a lower dielectric layer and an upper dielectric layer disposed over the lower dielectric layer and made of a different material than the lower dielectric layer, and
the upper dielectric layer includes at least one selected from the group consisting of $HfO_2$, HfSiO, HfSiON, HfTaO, HfTiO, HfZrO, zirconium oxide, aluminum oxide, titanium oxide, and a hafnium dioxide-alumina ($HfO_2$—$Al_2O_3$) alloy.

* * * * *